United States Patent
Mudulodu et al.

(10) Patent No.: US 8,359,499 B2
(45) Date of Patent: Jan. 22, 2013

(54) METHOD AND APPARATUS FOR DEINTERLEAVING IN A DIGITAL COMMUNICATION SYSTEM

(75) Inventors: Sriram Mudulodu, Santa Clara, CA (US); Ping Dong, Cupertino, CA (US); Jordan Christopher Cookman, San Jose, CA (US); Tao Yu, Milpitas, CA (US)

(73) Assignee: CSR Technology Inc., Sunnyvale, CA (US)

( * ) Notice: Subject to any disclaimer, the term of this patent is extended or adjusted under 35 U.S.C. 154(b) by 622 days.

(21) Appl. No.: 12/577,125

(22) Filed: Oct. 9, 2009

(65) Prior Publication Data

US 2010/0095191 A1  Apr. 15, 2010

Related U.S. Application Data

(60) Provisional application No. 61/104,688, filed on Oct. 10, 2008.

(51) Int. Cl.
*H03M 13/00* (2006.01)
*G06F 11/00* (2006.01)

(52) U.S. Cl. ......... 714/701; 714/776; 714/817; 375/348

(58) Field of Classification Search ............ 714/701, 714/776, 780, 817; 375/348, 349
See application file for complete search history.

(56) References Cited

U.S. PATENT DOCUMENTS

| 6,487,694 | B1  | 11/2002 | Bajwa |        |
|-----------|-----|---------|-------|--------|
| 7,228,483 | B2* | 6/2007  | Kuwahara | 714/755 |
| 7,292,650 | B2* | 11/2007 | Lee et al. | 375/316 |
| 7,502,982 | B2* | 3/2009  | Silvus et al. | 714/753 |
| 7,668,250 | B2* | 2/2010  | Limberg | 375/265 |
| 7,796,677 | B2* | 9/2010  | Kultala | 375/147 |
| 7,848,708 | B2* | 12/2010 | Matsumoto et al. | 455/69 |
| 2003/0108127 | A1 | 6/2003 | Elits et al. | |
| 2004/0190648 | A1 | 9/2004 | Anim-Appiah et al. | |
| 2007/0019761 | A1 | 1/2007 | Park et al. | |
| 2008/0148125 | A1 | 6/2008 | Bhora et al. | |

FOREIGN PATENT DOCUMENTS

| EP | 1 248 427 | 10/2002 |
| EP | 1 562 295 | 8/2005 |
| JP | 2008-236774 | 10/2008 |
| WO | WO-9821832 | 5/1998 |
| WO | WO-2007/149631 | 12/2007 |
| WO | WO-2008-096541 | 8/2008 |

OTHER PUBLICATIONS

Zhen-dong Zhang; Bin Wu; Yong-xu Zhu; Yu-mei Zhou;, "Design and implementation of a multi-mode interleaver/deinterleaver for MIMO OFDM systems," ASIC, 2009. ASICON '09. IEEE 8th International Conference on, vol. No., pp. 513-516, Oct. 20-23, 2009.*

(Continued)

*Primary Examiner* — Cynthia Britt
(74) *Attorney, Agent, or Firm* — Fulbright & Jaworski L.L.P.

(57) ABSTRACT

A method and apparatus for deinterleaving in a communication system is disclosed. The method and apparatus deinterleave data units using a data deinterleaver; compressed deinterleave input symbol quality information (SQI) units using a compressed deinterleaver, wherein at least one of the input SQI units deinterleaved by the compressed deinterleaver corresponds to at least one of the plurality of data units deinterleaved by the data deinterleaver; and apply the deinterleaved SQI units to the corresponding deinterleaved data units.

30 Claims, 8 Drawing Sheets

OTHER PUBLICATIONS

Yan Zhong et al: "A VLSI implementation of a FEC decoding system for DTMB (GB20600-2006) standard", 2007 7th International Conference on ASIC, Oct. 1, 2007, pp. 926-929, XP55017901, DOI: 10.1109/ICASIC.2007.4415783, ISBN: 978-1-42-441132-0.

European Search Report issued for European Patent Application No. 09820011.6, dated Feb. 20, 2012, 12 pages.
International Search Report and Written Opinion issued for PCT/US2009/060282, dated Jun. 7, 2010, 7 pages.

* cited by examiner

METHOD AND APPARATUS FOR DEINTERLEAVING IN A DIGITAL COMMUNICATION SYSTEM

CROSS REFERENCE TO RELATED APPLICATIONS

This application claims priority from U.S. Provisional Patent Application No. 61/104,688, for "Method and Apparatus for Deinterleaving in a Digital Communication System," filed Oct. 10, 2008, by Sriram Mudulodu, et al., the contents of which are incorporated herein by reference as though set forth in full.

BACKGROUND OF THE INVENTION

1. Field of the Invention

This invention relates generally to the field of digital communication systems and more particularly to deinterleavers employed in such systems.

2. Description of the Prior Art

An interleaver is commonly employed in a transmitter of a digital communication system for interleaving data such as bits or symbols. Correspondingly, a deinterleaver is commonly employed in a receiver of the digital communication system for reversing the interleaving process at the transmitter. The effect of employing an interleaver and a corresponding deinterleaver is that together they help to spread out local variations in the channel conditions more uniformly, so that the overall system performance is improved.

At the receiver, for instance, burst errors that occur due to noise or interference in the communication channel are spread out in time by the deinterleaver which can improve the performance of the forward error correction (FEC) decoder. Noise or interference may originate outside of the receiver, or may be caused by other blocks in the receiver itself. For example, a burst of errors may occur due to error propagation in a decision feedback equalizer (DFE). Interleavers also help in mitigating deep fades in a wireless communication channel. An interleaver is also an important component of turbo encoders where its use is a key contributor in the high performance of the codes.

Interleaving may be done at bit level or at symbol level. An example of a system that uses bit interleaving is the Orthogonal Frequency Division Multiple Access (OFDMA) mode of IEEE 802.16e standard. An example of a system that uses symbol interleaving is the Chinese Digital Terrestrial Multimedia Broadcast (DTMB) standard. See Chinese DTMB Standard, GB 20600-2006 (hereinafter referred to as the "Chinese DTMB Standard").

Block and convolutional interleavers are two common types of interleavers. An example of a system that uses a block interleaver is the OFDMA mode of IEEE 802.16e standard for wireless communications devices. An example of a system that uses convolutional interleaver is the Chinese DTMB Standard More than one interleaver may be employed at the transmitter each of which may require a corresponding deinterleaver at the receiver. A single deinterleaver at the receiver may also be used to reverse the operations corresponding to multiple interleavers of interest at the transmitter.

The memory required for interleaving and the interleaver delay or latency of an interleaver are two important parameters of the interleaver. Often, the larger the delay in the interleaver, the better its capability in reducing errors. The term "total time span" of an interleaver or deinterleaver, as used herein, refers to the delay of the interleaver or deinterleaver in time dimension. However, the larger the interleaver delay, the more the memory required to interleave at the transmitter and to deinterleave at the receiver. In broadcast applications, delay or latency is not a major concern. Hence very large interleavers are used. Accordingly and undesirably, there is a large memory requirement for the deinterleaver in the receiver, which adds to the cost of the receiver.

Efficient quantization methods such as dynamic quantization and/or block floating point representation of signals are known to reduce the word size and thereby also the memory required. However these techniques do not change the number of quantities being stored themselves and hence reduction in memory that is achievable is limited. Accordingly, to reduce receiver cost significantly, there is a need to reduce the amount of memory used in the deinterleaver beyond such techniques.

When the interleaving operation of the interest at the transmitter is at the symbol level, there are two options for deinterleaving corresponding to this interleaving operation. Most communication systems transmit data in form of symbols to which bits are mapped. These symbols are received at the receiver with noise and other impairments.

In single carrier systems, the received symbols can be converted to bit soft metrics which can then be deinterleaved. Alternatively, the received symbols can be deinterleaved and then converted to bit soft metrics. In attempting to obtain reliable bit soft metrics from a symbol, symbol quality information (SQI) which is associated with that symbol is needed. The transmitter does not transmit SQI. Rather, SQI is information regarding a received symbol, such as the signal-to-noise and interference ratio (SINR) associated with the received symbol. The receiver may contain a block that determines this for each symbol. In addition to deinterleaving the received symbols, the SQI associated with the received symbols also has to be deinterleaved, and is then used to obtain the bit soft metrics. In methods currently used, SQI and data are interleaved and deinterleaved using similar structures, requiring storage of similar number of quantities or values. Accordingly, a large amount of memory is required for interleaving and deinterleaving, particularly, in systems that employ large interleavers at the transmitter, as discussed above. Using large amounts of memory is undesirable, because it increases the cost.

In bit interleaved systems, deinterleaving is performed on bit soft metrics that are generally obtained by making use of the SQI associated with them. Stated differently, the received symbols are converted into bit soft metrics by using the SQI associated with the respective received symbols. These bit soft metrics are deinterleaved. Both symbol and bit interleavers may be employed at a transmitter. In the absence of a symbol interleaver, current implementations do not separate the SQI prior to deinterleaving and the bit soft metrics that are deinterleaved already contain the effect of SQI in them. A large amount of memory is required for systems such as broadcast systems that use interleavers with large delays.

Therefore, the need arises for a method and apparatus to reduce the amount of memory used for deinterleaving at the receiver of a digital communications system thereby reducing cost without experiencing significant loss in performance.

IN THE DRAWINGS

DETAILED DESCRIPTION OF VARIOUS EMBODIMENTS

Figure 1:
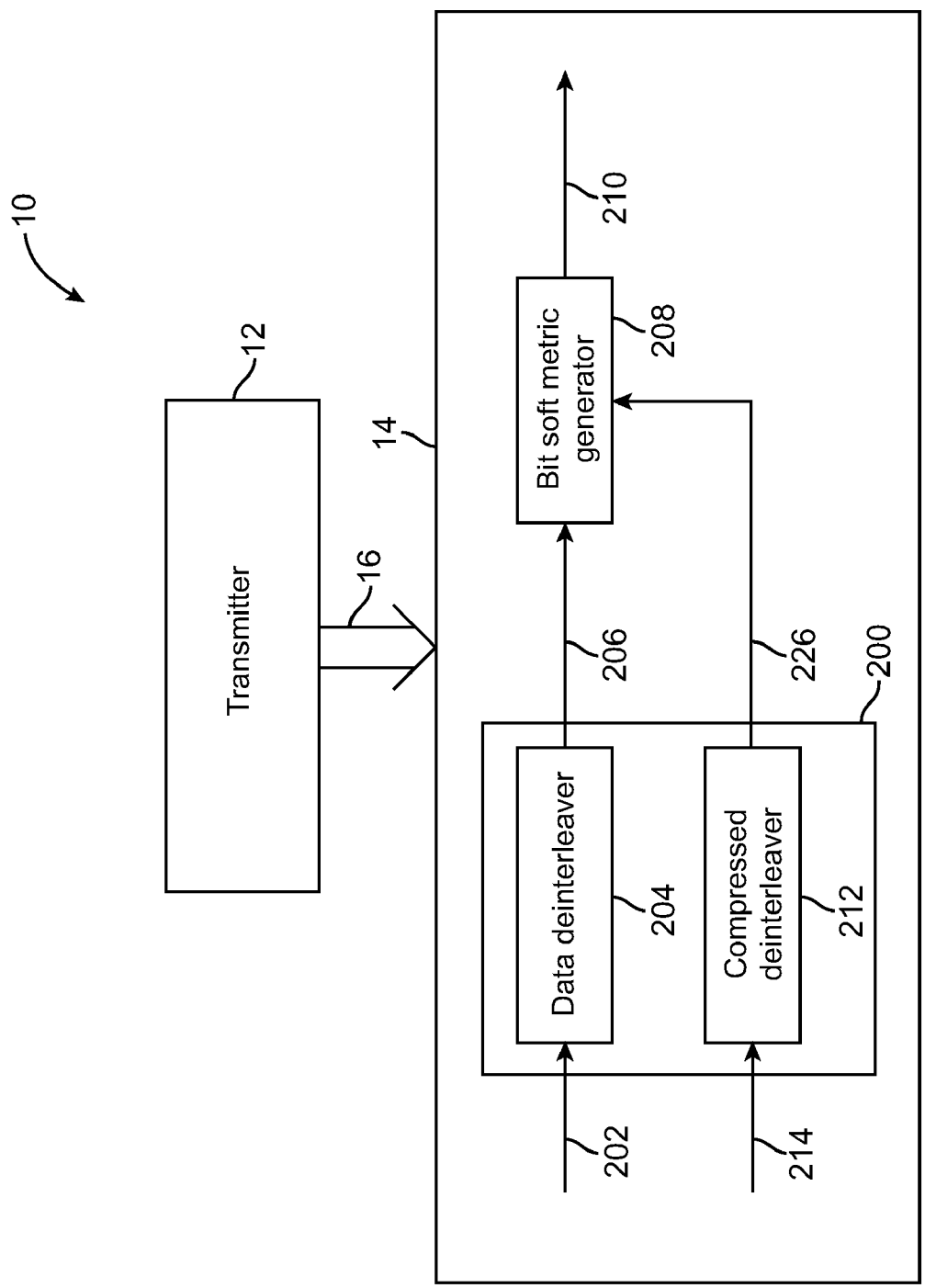
FIG. 1 shows a communication system 10, in accordance with an embodiment of the present invention.

The word "quantity" as used herein refers to anything that can be represented by one real number, one integer number or one complex number. The amount of memory used to store a set of quantities depends on the number of quantities (or values) being stored and the quantization word size used to represent the quantity. The word "substantially" as used herein is also understood to include exactly. The terms "quantization word size" or "word size" as used herein refers to the number of quantization bits or simply number of bits used to represent a single quantity or value. By efficient quantization of the quantities, a smaller word size can be used thereby reducing the memory required.

The term "received symbols" as used herein refers to the symbols at the output or input of any block in the receiver. The term "transmitted symbols" refers to the symbols at the output or input of any block in the transmitter. The word "symbol", as used herein in connection with information from a transmitter or to a receiver refers to a transmitted symbol or a received symbol. In multi-carrier systems such as OFDM system, typically this refers to the output of a Discrete Fourier Transform (DFT) block in the receiver. It may also be used to refer to the output of another block in the frequency domain processing part of the receiver. In single carrier systems, the received symbols is used to refer to the output of an equalizer. As used herein, the term "bit soft metric" is metric that indicates the probability that a bit is a value '1' or a value '0'. "Bit interleaved systems", as used herein, refers to systems with the interleaving operation of interest at the transmitter being performed at bit level.

The present invention generally describes a deinterleaver for use in communication receivers. The deinterleaver comprises a method and apparatus for separately deinterleaving received data and symbol quality information (SQI) when the corresponding interleaver of interest at the transmitter is a bit interleaver. When the interleaver of interest at the transmitter performs bit interleaving or symbol interleaving, the deinterleaver comprises a method and apparatus for separately deinterleaving received data and SQI, and further compresses the SQI to reduce the memory size requirements of the deinterleaver by exploiting time and/or frequency correlation properties of the SQI and/or by deinterleaving a transformed representation of the SQI.

The term "transformed representation" of a quantity as used herein refers to representing the quantity using a different form of it, or using a function of the quantity and representing the result of the function of the quantity instead of the quantity itself Multiple quantities may be used to obtain the transformed representation of a single quantity. This is different from and can be performed in addition to efficient and known quantization techniques such as dynamic quantization. The deinterleaved SQI is then appropriately applied to a conventionally deinterleaved symbols or bit soft metrics, before being applied to the subsequent block, which is typically a forward error correct (FEC) decoder. Those skilled in the art will appreciate that use or application of the SQI to generate bit soft metrics improves the quality of the bit soft metrics. Various embodiments of the present invention provide methods and apparatuses to reduce the memory required for deinterleaving when the corresponding interleaver of interest at the transmitter is a convolutional or a block interleaver. This deinterleaver has low cost due to reduced memory size requirements.

The deinterleaver may also correspond to more than one interleaver at the transmitter and/or other operations at the transmitter that change the order of the bits or symbols. The phrase "interleaver(s) of interest at the transmitter" as used herein may also include multiple such interleavers and all such operations of interest that change the order of bits or symbols, corresponding to a deinterleaving being performed. There may be other interleavers or operations that change the order of bits or symbols at the transmitter that may not be of interest. By exploiting time and/or frequency correlation in the SQI, and/or by using a transformed representation of SQI, the memory required for deinterleaving is reduced.

In multi-carrier systems, such as OFDM systems, different symbols or bits are subject to different signal to interference and noise ratios (SINRs). In the various embodiments of the present invention, each symbol may be associated with a different SINR or SQI, where SINR is used as SQI. In an embodiment of the present invention, a symbol on a given sub-carrier of a given OFDM frame is associated with a unit among a sequence of units of the input SQI. The input SQI may be provided by another block such as SQI estimator block that may already be present in the receiver. Stated differently, a SQI unit corresponds to a single sub-carrier of a single OFDM frame. SINR is one example of SQI. SQI is utilized to obtain suitable bit soft metrics. In other systems, such as single carrier systems, different bits or symbols can be subject to different channel conditions and using the SQI appropriately in such systems can also improve performance. Long interleavers at the transmitters can improve performance but also require that the receiver employ long deinterleavers. By reducing the memory associated with deinterleaving, the cost of the receiver is reduced.

The received symbols in single-carrier systems, such as the single-carrier mode of DTMB also may have different SQI associated with them due to changing channel or interference and noise conditions. Conventionally, the SQI is assumed to be the same for all the symbols and hence ignored in generating the bit soft metrics, and hence not deinterleaved. Instead the SQI may be used to generate the bit soft metrics as in a multi-carrier system to improve the performance. The term "memory" or "memory module" as used herein refers to a single or multiple register(s) in an Application Specific Integrated Circuit (ASIC) or a processor, or a portion, or all of a Random Access Memory (RAM) such as (static RAM) SRAM, (dynamic RAM) DRAM, or Read Only Memory (ROM) module. The term "memory element" as used herein refers to a partial or complete row of a RAM or a set of registers that are used to store a single quantity or value, such as a data unit which can be a received symbol or bit soft metric, or a SQI unit. The term memory size shall be used to refer to the number of bits used to store one or a set of quantities. These bits may extend across multiple words of a RAM, or multiple RAMs or registers.

The term "circuit" as used herein refers to hardware or software or a combination of the two used to implement certain function(s).

The term "multiple of an integer A" as used herein refers to any integer B, that can be divided by the integer A, with no remainder, including the integer A itself. The term, "strict multiple of an integer A" as used herein refers to any multiple of the integer A, other than the integer A itself The term, "sub-multiple of an integer A" as used herein refers to any integer B that can divide the integer A with no remainder, including the integer A itself. The term, "strict sub-multiple of an integer A" as used herein refers to a sub-multiple of integer A, other than integer A itself The notation ceil(A) represents the smallest integer that is greater or equal to a given real number A. The notation floor (A) represents the largest integer that is less than or equal to a given real number A. The notation mod(j,k) represents the modulus of integer j with respect to k The term "branch" of a convolutional interleaver or deinterleaver as used herein refers to a collection of units stored in a first in first out (FIFO) manner. The units of the branch could be symbols, bit soft metrics, or symbol quality information. A conceptual representation of a convolutional deinterleaver comprises several branches, with each branch storing a different number of units. However in practice, the units corresponding to a branch could be stored in a literal FIFO buffer constructed of registers or they could be stored in a RAM and addressed in the same order as if they were stored in FIFO registers. In practical implementation, all the branches in the conceptual representation of the convolutional deinterleaver may be stored in a single RAM and addressed or accessed in an order as if they are multiple branches each consisting of a FIFO of different size.

The word "correspond" as used herein refers to a one-to-one correspondence, one-to-many correspondence, many-to-one correspondence, or many-to-many correspondence.

The term "communication channel" as used herein may refer to the physical communication channel, possibly along with all the impairments such as noise and distortion. I may also include the resulting effect of RF (radio frequency) electronics, quantization, estimation errors, or other effects caused by one or more blocks of the transmitter and/or the receiver itself.

The size of the memory in number of bits required for deinterleaving is generally equal to the word size used for representation of the signal being deinterleaved, multiplied by the number of memory elements used. For the case of a bit interleaver, only 1 quantization bit is used to represent one data bit. But if a soft-decoding FEC is to be used in the receiver, the deinterleaver needs more than 1 quantization bit to represent a data unit corresponding to a data bit at the transmitter. The number of quantization bits used to represent a quantity is called its word size. Therefore, the term "bit deinterleaver" as used herein does not refer to a deinterleaver with 1 quantization bit per data unit, rather it refers to a deinterleaver wherein each data unit is representative of the corresponding transmitter bit.

The term "interleaver history size" as used herein refers to the largest delay in the interleaver and is the number of quantities required to be stored in the interleaver. It is a parameter of the interleaver. We shall use the notation Q1 to denote this history size. The term "interleaver delay" as used herein refers to the largest delay of a symbol from the input to the output of the interleaver, among all the symbols (or bits) that are fed to it. Generally, for a given interleaver type, larger the interleaver delay, larger is its history size and vice-versa. A convolutional interleaver requires less history size than a block interleaver for the same interleaver delay. The term "delay" as used herein refers to "interleaver delay" where the context is clear.

FIG. 1 shows a communication system 10, in accordance with an embodiment of the present invention. The communication system 10 is shown to include a transmitter 12, a receiver 14 and a communication channel 16. Examples of communication systems include but are not limited to systems that read from disk drives such as hard drives and optical drives, compact disks (CDs), dvd and blue-ray drives. A transmitter as used herein refers to written media, such as hard drives, optical or magnetic media used to store information as bits or symbols.

The receiver 14 is shown to include a deinterleaver 200, which is in turn shown to include a data deinterleaver 204 and a compressed deinterleaver 212. The deinterleaver 204 and the deinterleaver 212 are each shown coupled to the bit soft metric generator block 208. More specifically, the deinterleaver 204 is shown to receive data 202 and to generate deinterleaved data 206 to the block 208. Stated differently, block 204 is shown to receive one or more data units and to generate one or more deinterleaved data units.

The compressed deinterleaver 212 is shown to receive input SQI units 214 and to generate one or more deinterleaved SQI units 226 to the block 208. At least one unit of the SQI units 214 corresponds to at least one unit of the data 202 received by the data deinterleaver 204. The deinterleaver 204 is operative to generate one or more (deinterleaved) data units 206 and at least one deinterelaved data unit at the output of block 204 corresponds to at least one of the deinterleaved SQI units 226 at the output of block 212. The block 208 generates bit soft metrics 210.

The data deinterleaver 204 deinterleaves the data units 202 to generate deinterleaved data units 206. The compressed deinterleaver 212 performs compressed deinterleaving of the input SQI units 214 to generate deinterleaved SQI units 226. The deinterleaved SQI units 226 that the compressed deinterleaver 212 generates correspond to the deinterleaved data units 206 generated by the data deinterleaver 204. The bit soft metric generator 208 uses the deinterleaved data units 206 and the deinterleaved SQI units 226 together to generate the bit soft metrics 210.

In some embodiments, every unit of the deinterleaved SQI units 226 corresponds to at least one unit of the deinterleaved data unit 206.

In some other embodiments, at least one input SQI unit 214 does not exactly correspond to any unit of the data units 202. In these embodiments, the compressed deinterleaver 204 processes at least one input SQI unit 226 that does not correspond to a data unit 206 but generates the deinterleaved SQI units 226 such that every unit there corresponds to at least one unit of the deinterleaved data units 206. This may occur where the data units of interest are combined or interleaved with data units or quantities that are not of interest to the data deinterleaver 204, the latter referred to as "other data units".

In some embodiments, the compressed deinterleaver 212 advantageously also processes SQI units 226 corresponding to the other data units but generates only deinterleaved SQI units 226 that correspond to deinterleaved data units 206. An example of this is when pilot sub-carriers are mixed with data sub-carriers in an OFDM system, wherein the SQI units also includes SQI corresponding to pilot sub-carriers. Another example is in DTMB multi-carrier mode, where system information sub-carriers that convey information about various options of the system are transmitted in addition to data sub-carriers. In yet another embodiment of the invention, the SQI units 226 includes the SQI corresponding to the system information sub-carriers. These do not correspond to any of the data units.

In some embodiments, at least one of the data units 206 does not correspond to any of the SQI units 226. This may be done, for example, to avoid the need to estimate certain SQI units or to reduce the number of the SQI units being processed by the compressed deinterleaver 212.

In various embodiments of the present invention, one unit of the SQI units 226 corresponds to one unit of the data units 206. For example, this may be the case where the data deinterleaver 204 is a symbol level deinterleaver and the data units 206 are symbols. In other embodiments, one unit of the SQI units 226 corresponds to more than one data unit 206. For example, this may be the case where the data deinterleaver 204 is a bit level deinterleaver and the data units 202 are bit soft metrics.

The deinterleaver 212 performs compressed deinterleaving of the SQI units 214 which comprises compression and expansion of the SQI units. That is, input SQI units 214 are compressed and stored in memory (shown in FIG. 7) with a reduced memory size requirement than that of prior art techniques, and then subsequently the stored input SQI units are expanded to generate deinterleaved SQI units 226. At any given time, deinterleaver 212 stores a smaller number of quantities or units than the number of data units stored by the data deinterleaver 204.

In generating the deinterleaved SQI units 226, the number of units in deinterleaved the SQI units 226 is the same as that of prior art and larger than the number of quantities stored in memory. Stated differently, deinterleaver 212 performs expansion of the compressed SQI units stored in memory. This process typically results in some loss of information. Hence, in the case of symbol deinterleaver, the output is not exactly the same as in the case of prior art, but may be designed such that they are not significantly different from them so that the loss does not significantly affect the performance.

Bit soft metric 210 is an indication of the likelihood that a received bit was a 0 or 1, and is generally used by an FEC decoder that employs soft-decoding techniques. When the data units in the data deinterleaver 204 correspond to receive symbols, a single data unit at the output of the data deinterleaver 204 may correspond to multiple bits. For example, if the data deinterleaver 204 is a symbol deinterleaver, and the transmit symbols are chosen from a 64-quadrature amplitude modulation (QAM) constellation, each symbol represents 6 data bits, and therefore the bit soft metric generator 208 generates 6 bit soft metrics as the bit soft metrics 210 per deinterleaved data symbol 206. The bit soft metrics 210 may be subsequently fed to an FEC decoder. The bit soft metrics 210 may be log likelihood ratios (LLRs) of the transmitted bits.

In an embodiment of the present invention, the data 202 includes data units that are symbols generated at the output of a Frequency-domain Equalizer (FEQ, not shown) in a multi-carrier system. In another embodiment, the data 202 includes data units that are symbols at the output of an equalizer in a single carrier system. In yet another embodiment, when the interleaver(s) 227 is a bit interleaver, the data 202 are preliminary bit soft metrics, such as the outputs of a soft slicer. Soft slicers are well known, by those having ordinary skill in the art, for converting a data symbol into a set of soft values, one for each bit represented by the symbol. Soft values indicate the reliability of a bit being 0 or 1.

Data deinterleaver 204 generally performs deinterleaving utilizing a memory size equal to Q1*W4 bits, where the memory size is a suitable size for storing Q1 number of data units, included in a sequence of units of the data 202, using a word size of W4 bits, to produce deinterleaved data units of a sequence of units of the deinterleaved data 206. The deinterleaved data units 206 are essentially the same data units as the data units 202 except that they are in a different order (or deinterleaved).

In the case when the data units are received symbols, for the same precision, the word size is typically less in a multi-carrier system when the data 202 is the symbol output of an FEQ in a multi-carrier system, than when the data 202 is not the output of an FEQ, but instead directly the output of a discrete Fourier transform (DFT), such as is frequently implemented using a fast Fourier transform (FFT) method. The dynamic range of data 202 is smaller when it is the output of an FEQ, because the FEQ reduces variation due to the channel frequency response.

In one embodiment of the present invention when the transmitter uses symbol interleaving, the data 202 are the received symbols at the output of a FEQ in a multi-carrier receiver, and input SQI 214 are provided by an SQI estimator, corresponding to each sub-carrier. In another embodiment, the data 202 are symbols at the output of a time domain equalizer in a single carrier receiver, and the input SQI 214 are provided corresponding to each symbol location within a frame. In yet another embodiment when the interleaver of interest at the transmitter is a bit interleaver, data 202 are outputs of a soft slicer, and input SQI 214 are provided for each set of data 202 corresponding to a single received data symbol. Those skilled in the art will appreciate that SQI is generally applied to the received data symbols, especially when these symbols are output of an FEQ, to produce bit soft metrics. In one embodiment when the applying operation is simply a multiply operation, SINR is a commonly-used SQI.

Figure 7:
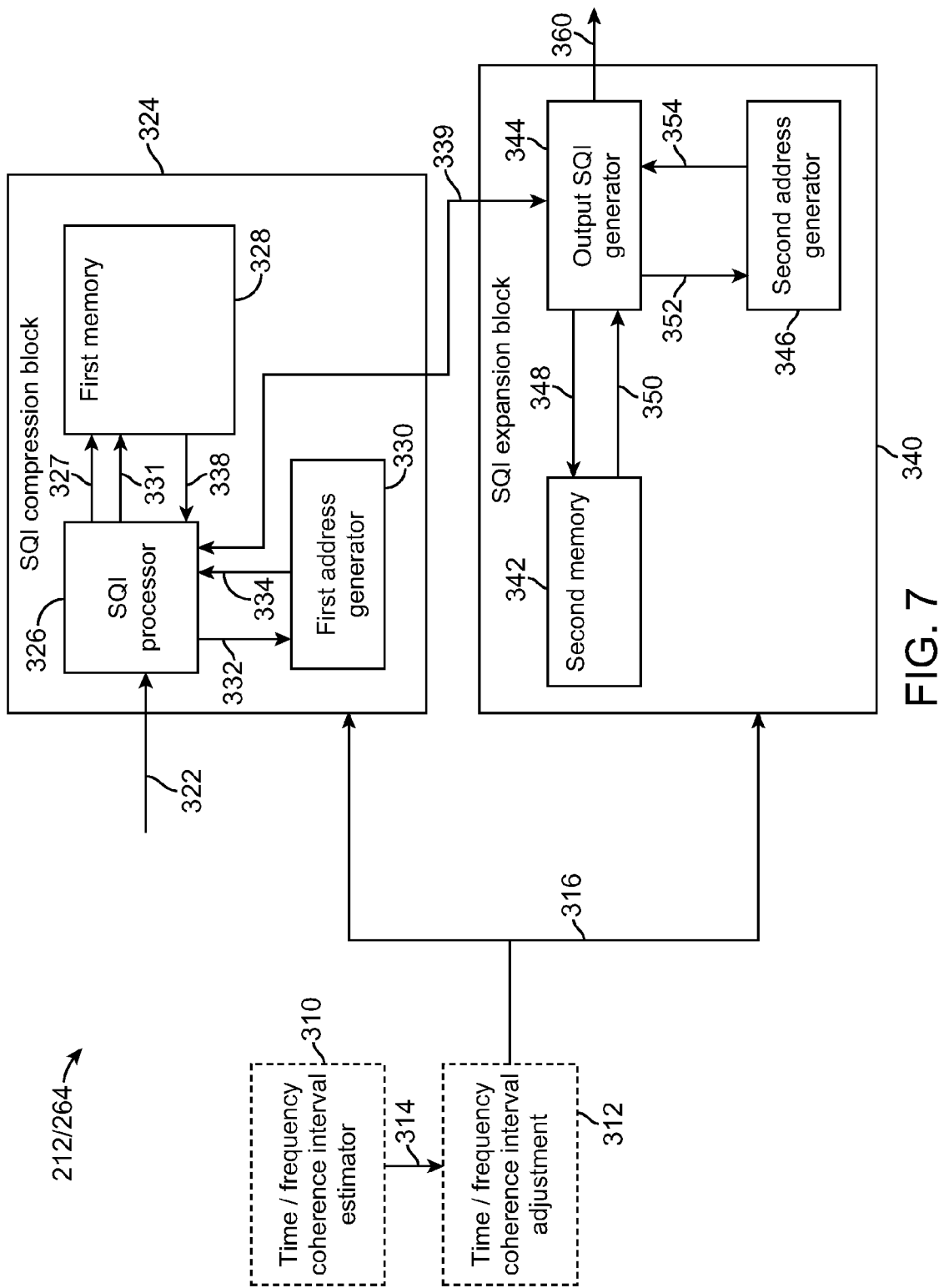
FIG. 7 shows further details of the compressed deinterleaver blocks of FIGS. 1 and 6, in accordance with an embodiment of the invention.

In accordance with an embodiment of the present invention, the input SQI 214 is first compressed by the deinterleaver 212, and then stored in memory (shown in FIG. 7). In other embodiments, the compression and storage functions are performed simultaneously.

In accordance with various embodiments of the present invention, the input SQI 214 are signal-to-interference-and-noise ratios (SINRs) associated with the corresponding data symbols. In other embodiments, the SQI units of the input SQI 214 are squares of the absolute values of the channel gains associated with the corresponding data symbols.

In accordance with various embodiments of the present invention, the word size W5 used to represent and store the compressed SQI units is much less than the word size W2 used to represent the input SQI units. In one embodiment, where the SQI unit is the square of absolute values of the channel gain associated with the data symbol, a transformed representation of input SQI units, namely, the absolute value of the channel gain associated with the corresponding data symbol, is used inside the compressed deinterleaver 212, whereby W5 can be made less than the word size required to represent the input SQI units, without much loss in accuracy. Note that this is different from dynamic quantization or block floating point representation where there is no such transformation.

In accordance with some embodiments of present invention, the number of memory elements, Q2, stored in order to generate the plurality of deinterleaved SQI units 226 is much less than the corresponding number of memory elements, Q1, used to store the plurality of SQI units in prior art structures. This is achieved by the use of compressed deinterleaving by the deinterleaver 212 of input SQI 214, wherein at least either the compression in the time dimension or the compression in the frequency dimension and joint compression in both frequency and time dimensions is performed on the input SQI 214. The results of the compression, namely compressed SQI units are stored, and subsequently these results are expanded to generate the deinterleaved SQI units 226 generated by the deinterleaver 212.

In accordance with an embodiment of the present invention, the compression performed by the deinterleaver 212 may be performed by grouping some units of input SQI 214 and representing the group by one quantity whose value is a function of the group of these units, such as by the average or mean, that essentially results in advantageously compressing the SQI and thereby requiring a reduced memory size for deinterleaving SQI.

Those skilled in art will appreciate that there are several types of averages that may be employed by the deinterleaver 212, such as moving average, block average and infinite impulse response (IIR) type average.

An effective averaging includes a block average of the group of units and does not have the influence of any units outside of this group. In another embodiment, the mean of grouped units of input SQI is used to represent the group of SQI units. In yet another embodiment, the sum of the grouped units of input SQI is used to represent them. This does not necessarily deteriorate performance significantly. In various embodiments, compressed deinterleaving improves performance. This happens because the accumulation or averaging operation on the input SQI 214 units improves the quality of the SQI. For example the SQI 214 units may have estimation error. In an embodiment when summation or averaging is done by the compressed deinterleaver, a compressed SQI unit has smaller error than the individual input SQI units that are used to generate the compressed SQI unit. The error is therefore also reduced in the deinterleaved SQI units 226 as a result of the accumulation or averaging operations. As a result improved SQI is applied to the deinterleaved data units 206, whereby the performance of the system is improved.

In various embodiments compression may be performed in the time domain across multiple OFDM symbols or frames. In some embodiments compression may be performed in the frequency domain across multiple sub-carriers. In various other embodiments, compression may be performed in both time and frequency domains. The stored quantities are expanded to generate the deinterleaved SQI 226. Stated differently, the compressed deinterleaver 212 is configured to compress the input SQI 214 units, store the results of compression and to subsequently expand the stored results, namely the compressed SQI units to generate the deinterelaved SQI units 226.

In various embodiments, wherein at least one data unit of the data units 202 is a symbol, compressed deinterleaving is performed on the plurality of input SQI 214 units to generate deinterleaved SQI units 226, wherein every unit of the deinterleaved SQI units 226 corresponds to at least one unit of the deinterleaved data units 206.

Figure 2:
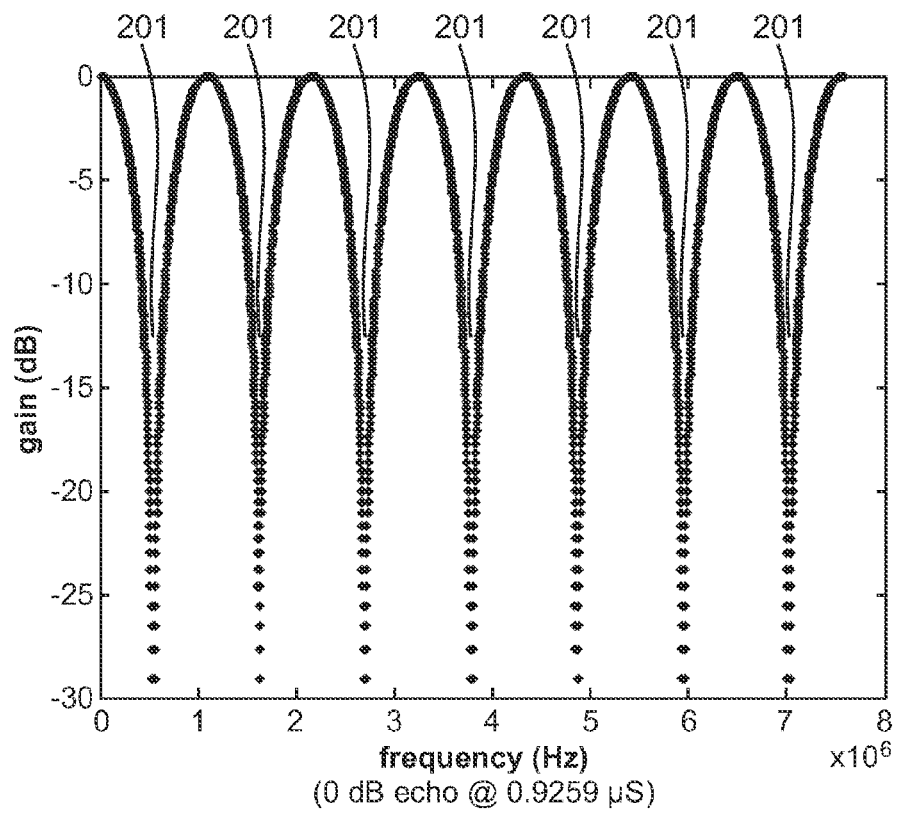
FIGS. 2-5 show various graphs of frequency responses of a communication channel with the magnitude of the channel gain (in dB) shown by the y-axis vs. frequency (in Hz), shown by the x-axis.

FIG. 2 shows a graph of an exemplary frequency response of the receiver 14. In FIG. 2, magnitude of gain (in dB) is shown along the y-axis and frequency (in Hz) is shown along the x-axis.

More specifically, FIG. 2 shows the frequency response of a channel that has a 0 dB echo at approximately 0.9249 micro seconds (μsec) delay. It is noted that 0 dB echo channel is one with two paths of equal power. This channel has notches in its frequency response at intervals of 1/0.9259 μsec, which is 1.08 Mega Hertz (MHz). Within the Digital Terrestrial Multimedia Broadcast (DTMB) signal band of 7.56 MHz, for example, there are 7 notches, as shown at 201.

Figure 3:
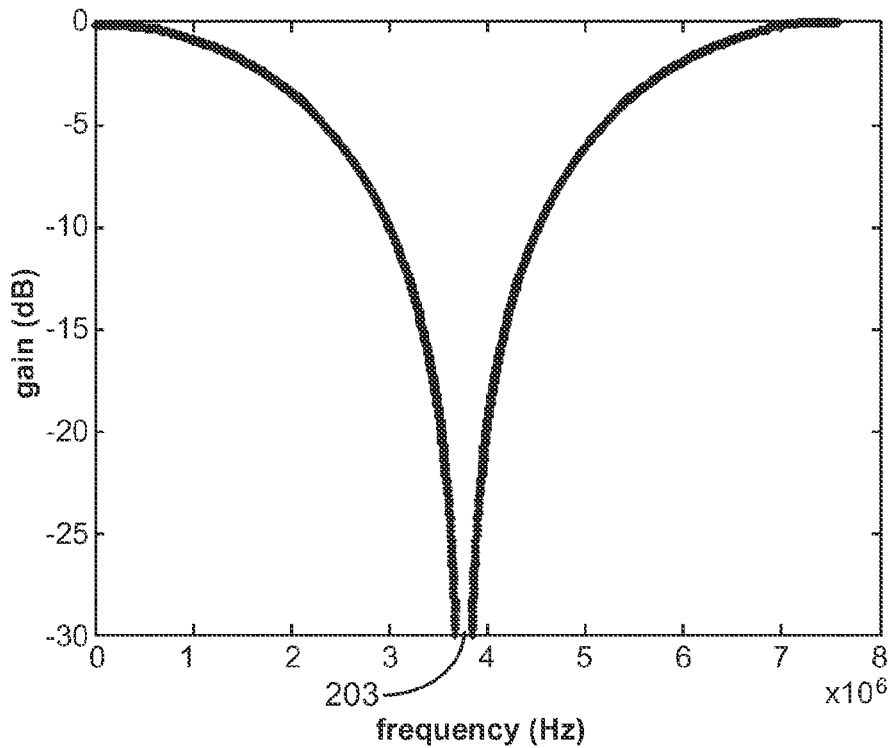
Figure 4:
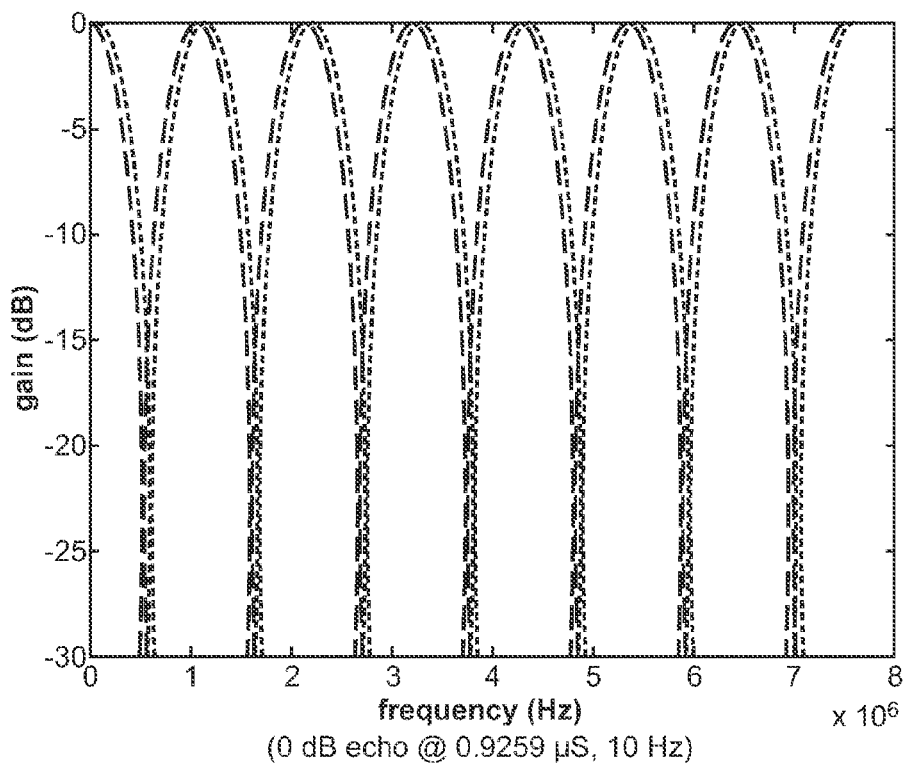
Figure 5:
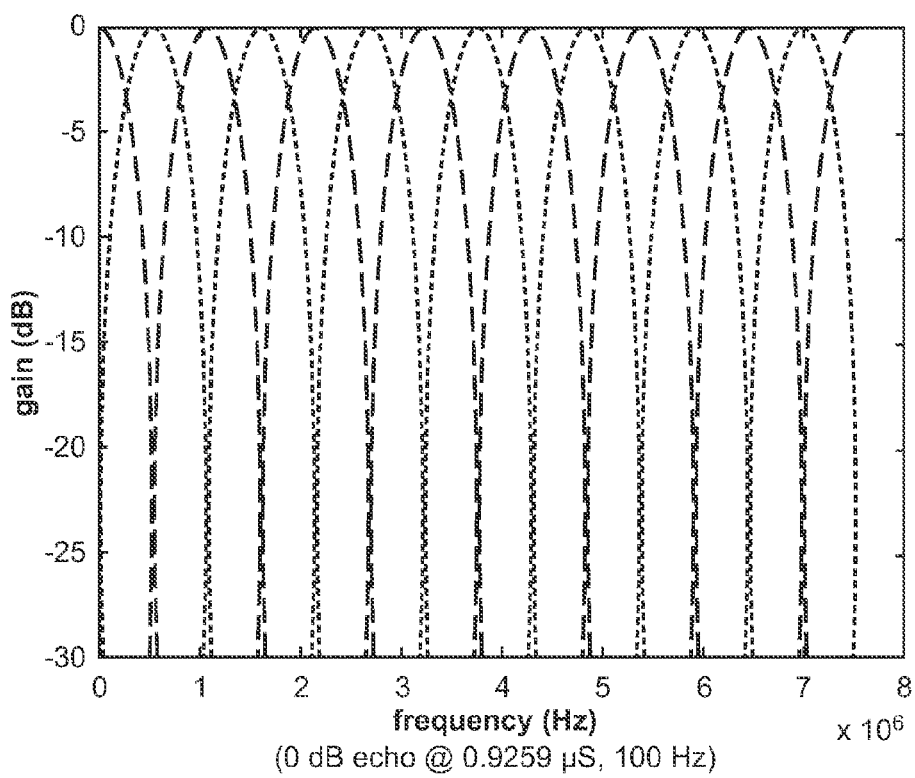

FIGS. 3-5 all show the gain and frequency on the same axes as that of FIG. 2. In accordance with one embodiment of the present invention, compression may be performed across frames; and, in accordance with other embodiments of the present invention, compression may be performed over sub-carriers within a frame. Alternatively, a combination of these two compression methods may be employed.

FIG. 3 shows the frequency response of a channel with a 0 dB echo at approximately 0.132 μsec delay. This channel has notches in its frequency response at intervals of 1/0.132 μS, which is 7.56 MHz. Within the DTMB signal band of 7.56 MHz, there is exactly 1 notch, shown at 203.

In the multi-carrier mode of DTMB, there are 3780 sub-carriers, evenly spaced throughout the 7.56 MHz band. From FIGS. 2 and 3, it is clear that the frequency response of adjacent sub-carriers is more similar for the system shown in FIG. 3 than for the system shown in FIG. 2. In other words, the signal of FIG. 3 has greater frequency coherence. Therefore, using the methods and embodiments of the present invention, the plurality units of input SQI may be represented by using fewer memory elements in the system of FIG. 3 than in the system of FIG. 2.

FIG. 4 shows the frequency response of a channel with a 0 dB echo at approximately 0.9259 μS delay, with 10 Hz Doppler frequency. (Note: In this channel model, Doppler frequency represents a frequency offset between the two paths, causing the frequency response to change over time.) Two frames of the channel response are shown in FIG. 4—the delay between the two is 8 frames.

FIG. 5 shows the frequency response of a channel with a 0 dB echo at approximately 0.9259 μS delay, with 100 Hz Doppler frequency. Again, two frames of the channel response are shown, and the delay between the two is 8 frames.

From FIGS. 4 and 5, it is clear that the frequency response of consecutive frames is more similar for the case of FIG. 4 than for the case of FIG. 5. In other words, the signal of FIG. 4 has greater time coherence. Therefore, more frames can be grouped together and represented by one quantity in FIG. 4 than in FIG. 5.

FIGS. 2-5 illustrate the concepts of time and frequency coherence. More specifically, FIGS. 2 and 3 illustrate lesser and greater frequency coherence, respectively; while FIGS. 4 and 5 illustrate greater and lesser time coherence, respectively.

In some embodiments, the number of memory elements, Q2 and the word size used to represent the quantities from time and/or frequency compression of the input SQI, W5, are both made less than Q1 and W2, respectively, whereby the memory required for the compressed deinterleaver 212 is reduced compared to that required by prior art structures.

Figure 6:
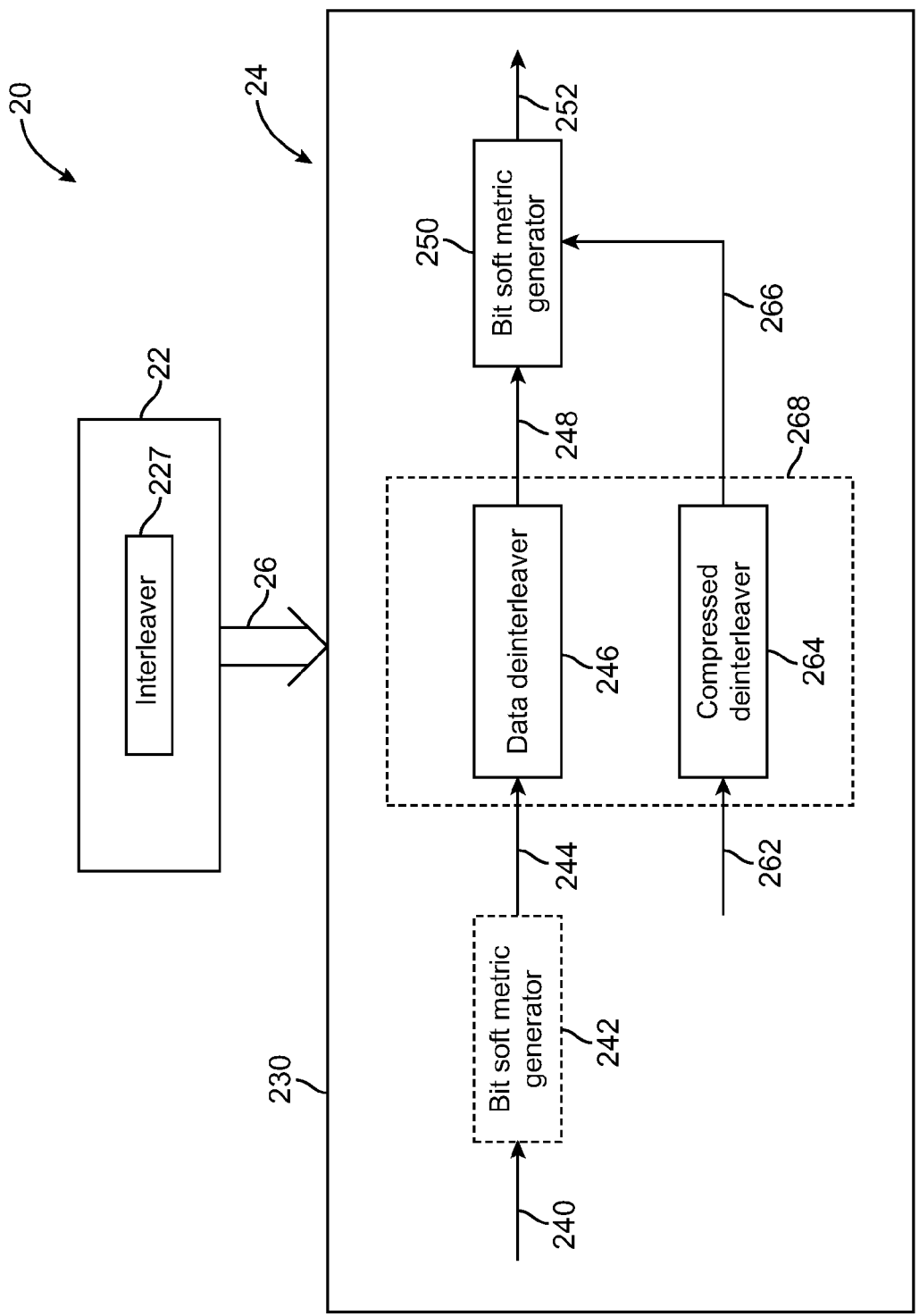
FIG. 6 shows a communication system 20, in accordance with an embodiment of the present invention.

FIG. 6 shows a communication system 20, in accordance with an embodiment of the present invention. The communication system 20 is shown to include a transmitter 22, a receiver 24 and a communication channel 26. Receiver 24 receives information transmitted by the transmitter 22 through the communication channel 26.

The transmitter 22 is shown to include an interleaver 227 for interleaving bits or symbols prior to transmission through the communication channel 26 to the receiver 24. It is understood that while one interleaver is shown included in the transmitter 22, that multiple interleavers may be included in the transmitter 22. The interleaver 227 may itself also comprise multiple interleavers or multiple interleaving operations.

The receiver 24 is shown to include a circuit 230 that has a deinterleaver 268 corresponding to the interleaver 227 when it is a bit interleaver, in accordance with an embodiment of the present invention. The circuit 230 is further shown to include a first bit soft metric generator 242 and a second bit soft metric generator block 250. Deinterleaver 268 comprises a data deinterleaver 246 and a compressed deinterleaver 264.

In accordance with one embodiment of the present invention, the soft metric generator 242 may be a soft slicer. Soft metric generator 242 is shown to receive data symbols 240, and to generate the data units 244, which may be preliminary soft metrics, to data deinterleaver 246. The data deinterleaver 246 is configured to the data units 244 to generate a plurality of deinterleaved data units 248. In an embodiment of the present invention, the data units 244 are preliminary bit soft metrics. Data deinterleaver 246 is shown to generate a bit data deinterleaver output 248, which serves as input to the bit soft metric generator 250. Bit soft metric generator 250 also receives input 266 from compressed deinterleaver block 264. The compressed deinterleaver 264 is configured to compress deinterleave one or more input SQI units to generate one or more deinterleaved SQI units. More specifically, compressed deinterleaver block 264 is shown to receive input SQI 262 and to generate deinterleaved SQI 266, which serves as input to the bit soft metric generator 250. Bit soft metric generator 250 is shown to generate bit soft metrics 252 by using or applying deinterleaved SQI units 266 to the deinterleaved data units 248.

In accordance with one embodiment of the present invention, the symbols 240 are received symbols, which may be the output from an FEQ in a multi-carrier system. In accordance with another embodiment of the present invention, the symbols 240 are received symbols, which may be the output of an equalizer in a single carrier system. The block 242 generates data units that are preliminary bit soft metrics. These are fed as input to the data deinterleaver block 246. In accordance with one embodiment of the present invention, the bit soft metric generator block 242 is a soft slicer. The bit soft metric generator block 242 need not take SQI as its only type of input.

In one embodiment of the present invention, the bit soft metrics (or data information) appearing on data units 244 are log-likelihood ratios (LLRs) of the bits appearing on symbols 240. The data units 244 are then deinterleaved by the data deinterleaver 246, resulting in an arrangement of the bit soft metrics in the same arrangement as that of the data bits input to the interleaver 227 of the transmitter 22. The compressed deinterleaver 264 deinterleaves input SQI 262 associated with the symbols 240. The input SQI 262 may also contain input SQI units that are not associated with the symbols 240. These are processed by the compressed deinterleaver also.

Those skilled in the art will appreciate that multiple data units of the data units 244 may be associated with or correspond to a single unit of input SQI 262. The number of multiple data units may be equal to the number of bits per symbol of the constellation, denoted herein by "S". The deinterleaved data units 248 of the data deinterleaver 246 and the deinterleaved SQI units 266 of the compressed deinterleaver 264 are used by the bit soft metric generator 250, to generate bit soft metrics 252. At any given time the number of quantities or units stored by the compressed deinterleaver 264 is less than the number of data units stored by the data deinterleaver 246.

In some embodiments, at any given time, the number of quantities or units stored by the compressed deinterleaver 264 is less than the number of data units stored by the data deinterleaver 246, divided by S.

When the interleaver 227 of the transmitter 22 interleaves bits, the circuit 230 does not deinterleave bits. Rather, the circuit deinterleaves soft bits. Soft bits are different from bits in that, where a bit at the transmitter is represented by 0 or 1, and the transmitter interleaves a sequence of 0's and/or 1's, at the receiver the deinterleaving is not done on 0's or 1's, but, rather, it is performed on bit soft metrics, or soft bits, which are quantities that represent the likelihood of the received bit being a 0 or a 1.

In an exemplary embodiment, bit soft metrics are represented by quantities from −31 to +31; where negative quantities are likely 0, with −31 being the strongest 0, and positive quantities are likely 1, with +31 being the strongest 1. In this representation, a quantity of 0 represents a bit that is just as likely to be 0 as it is 1. A word size of 6 quantization bits may be used to represent the bit soft metrics in this case.

The amount of memory used for deinterleaving in prior art receivers is generally $Q1*W3$ (where Q1 is the number of quantities being stored and W3 is the word size). The amount of memory used for deinterleaving, in the embodiment of FIG. 6, is $Q1*W6+Q2*W7$, where W6 is the word size used to represent each quantity at the data units 244, and W7 is the word size used to represent SQI units in the compressed deinterleaver 264.

Those skilled in the art will appreciate that the variation in SINRs associated with different bits can be as large as 25 dB to 30 dB in certain wireless channels. In prior art techniques, the SQI is not separated from data that is being deinterleaved and hence the variation (or dynamic range) of the data in prior art systems is much larger than that of the data units 244. This is because the data units 244 are derived from symbols after FEQ and the SQI has been separated.

The number of squantities or compressed SQI units stored for deinterleaving purposes in the compressed deinterleaver 264, Q2, is less than or equal to Q1/S. For large constellations, S is large. The value of Q2 can be reduced much below Q1/S by use of frequency and time compression, as will be described below. This reduction depends on the channel characteristics. By choosing $Q1*W6+Q2*W7<Q1*W3$ the memory used for deinterleaving is reduced.

In accordance with various embodiments of the present invention, when the transmitter performs bit level interleaving, a switch is used at the receiver to determine if the deinterleaver is implemented as described above or using prior art method.

The switching operation performed by the switch is done based on channel characteristics determining block In an embodiment, time coherence interval is the period of time over which the absolute value of the channel gain does not change by a significant amount. In another embodiment, time coherence interval is the longest period of time over which the ratio of the variance of the absolute value of the channel gain normalized by the average value of the square of the absolute values of the channel gains during the period is less than a predetermined threshold.

In one embodiment, frequency coherence interval is the maximum number of contiguous sub-carriers over which absolute value of the channel gain does not change by a significant amount. In another embodiment, frequency coherence interval is the maximum number of contiguous sub-carriers across which the ratio of the variance of the absolute value of the channel gain normalized by the average value of the square of the absolute values of the channel gains during the period is less than a predetermined threshold. In accordance with an embodiment of the present invention, this block measures the product of the time and frequency coherence intervals to obtain a time coherence interval estimate and a frequency coherence interval estimate. In some embodiments, these estimates may further be adjusted after which the product is taken. When this product exceeds a threshold, deinterleaver 268 may be used, otherwise, a prior art structure is used where data and SQI are not separately deinterleaved.

In some embodiments, where at least one data unit is a bit soft metric, compressed deinterleaving is performed on input SQI units to generate deinterleaved SQI units, where at least one unit of the deinterleaved SQI units corresponds to at least one unit of the deinterleaved data units.

FIG. 7 shows further details of the deinterleavers 212 or 264, in accordance with an embodiment of the present invention. The deinterleavers 212 or 264 are shown to include a time/frequency coherence interval estimator block 310 and a time/frequency coherence interval adjustment block 312, a SQI compression block 324, and a SQI expansion block 340. Optionally, block 310 may be part of the receiver 24 and used for other purposes, and therefore may be located externally to the blocks 212 or 264; for this reason, it is shown by a dashed line. Alternatively, block 310 is located within the receiver 24 or may be a part of the blocks 324 or 340. In an embodiment of the present invention, block 312 may also be located externally to the receiver 24 or a part of the blocks 34 or 340 and hence also showed by a dashed line. In some embodiments, blocks 310 and 312 may not be present.

The SQI compression block 324 is shown to include a SQI processor 326, a first address generator 330 and a first memory 328. The SQI processor 326 is responsive to input SQI units 322 and is operative to generate the address and control signal 327, and the data signal 331 and the control signal 332. The first memory 328 is shown to receive the signal 327 and the signal 331 and to generate the signal 338, which is the content at the location identified by the address in the signal 327 in memory 328, to the SQI processor 326. The first address generator 330 is shown coupled to receive the signal 332 and to generate the address signal 334 (sometimes referred to as the "generated address signal 334" herein) to the SQI processor 326.

The SQI expansion block 340 is shown to include a second memory 342, an output SQI generator 344 and a second address generator 346. The second memory 342 is shown coupled to the output SQI generator 344 and the second address generator is also shown coupled to the output SQI generator 344. The output SQI generator generates a control signal 352 to the second address generator which generates memory address 354 in response. The output SQI generator provides address and control signal 348 to second memory 342. The second memory 342 responds with the content of the memory at the requested address included in 348 to output SQI generator in signal 350. The deinterleaved SQI 360 is generated by the output SQI generator 344 as the output of SQI expansion block 340. The signal 339 is shown coupling the SQI processor 326 to the output SQI generator 344.

In some embodiments, the SQI compression block 324 is responsive to input SQI units, 322 and is configured to perform at least one of or more of the steps of transforming the representation, accumulating, storing or reading at a location in a first memory 328. These operations may be performed by the SQI processor 326 that is coupled to the first memory 328 and to the first address generator 330. The location in the first memory 328, is identified by an address generated by a first address generator 330. In these embodiments, the SQI expansion block 340 is configured to perform at least one of an inverse transforming, repeating, scaling and reading operation from a location in a second memory 342, in order to generate deinterleaved SQI 360. These operations may be performed by an output SQI generator 344 that is coupled to the second memory 342 and to the second address generator 346. The location in the second memory 342 is identified by an address generated by a second address generator 346.

In some embodiments, the first memory 328 is the same physical memory as the second memory 346. In other embodiments, the first address generator 330 and the second address generator 346 may be different physical memories. In yet other embodiments of the invention, the first memory 328 and second memory 346 are different memories, but alternate periodically.

In some embodiments, the first address generator 330 provides the generated address signal 334 to the SQI processor 326 in response to the control signal 332. In these embodiments, the second address generator 346 provides its generated address 354 in response to a control signal 352 from the output SQI generator 344.

Time/frequency coherence interval adjustment block 312 provides adjusted time and frequency coherence interval values on the signal 316 to the SQI compression block 324 and to the SQI expansion block 340. These values may be provided to the SQI processor 326 and the first address generator 330, and to the output SQI generator 344 and the second address generator 346.

The time/frequency coherence interval estimator 310 provides signals 314 to the time/frequency coherence interval adjustment block 312. The adjusted time coherence interval is represented by L1 and the adjusted frequency coherence interval is represented by L2. The preliminary time coherence interval estimate, L_1 and/or preliminary frequency coherence interval L_2 included in 314 are used by the time/frequency coherence interval adjustment block 312 to generate the adjusted time coherence interval L1 and/or adjusted frequency coherence interval L2. The preliminary coherence interval estimates, which is passed on in the signal 314 from the estimator 310 to the adjustment 312 and the adjusted coherence interval estimates, which is passed on in the signal 316 may both vary over time and/or frequency. Time/frequency coherence interval adjustment block 312 is optional, and may be absent in accordance with an alternative embodiment of the present invention. In an embodiment where block 312 is not present the time and frequency coherence values to be used are provided by the estimator 310 directly. In another embodiment where block 312 is not present, the time and frequency coherence values to be used are fixed to some design parameters.

The input SQI 322, in accordance with an embodiment of the present invention, includes one or more input SQI units (or values). The input SQI 322 may be input SQI 214 or input SQI 262. The SQI processor 326 processes the input SQI 322. When the communication system is a multi-carrier system and the data deinterleaver is a symbol level convolutional deinterleaver, in accordance with the preferred embodiment of the present invention, the SQI processor 326 accepts the n-th input SQI unit 322, provides the control signal 332 that includes the value of n and a request to generate a memory address, to the first address generator 330. In this embodiment of the invention the first and the second memory, memories 328 and 342, are the same. The first address generator 330 then generates an address based on at least the values of n, L1 and L2 and provides this to the SQI processor 326. The address generated by the first address generator 330 may also depend on other factors such as the requirement for a separate frequency deinterleaving operation corresponding to a frequency interleaving operation at the transmitter. Based on at least the values of n, L1 and L2, the SQI processor 326 performs one of the following two operations: "write/store only" operation where it stores the (value of) input SQI unit 322 at the location in the memory identified by the address provided by the first address generator 330, and accumulate operation where it reads the content of the memory 328 at the location in the memory identified by the address provided by the first address generator 330 and adds the (value of) input SQI unit 322 to it, and writes or stores the result back to the same memory location.

The SQI processor 326 decides between the above two operations based on an accumulate_decision that is also generated by it. When accumulate_decision is TRUE or YES or 1, the accumulation operation is performed, otherwise the "write only" or "store only" operation is performed. In both cases, a write or store operation occurs, but a read operation occurs only when accumulate_decision is true. The address and control signal 327 contains the generated address signal 334 and control that indicates whether the operation to be performed by the first memory 328 is a read or write operation. Either the result of the accumulation or the value of input SQI unit 322 is carried by the data signal 331 to the memory 328 along with the address and write signal carried by the signal 327. The memory 328 provides the content at the memory address, specified by the signal 327, when the signal 327 contains a read control signal and provides this content to the SQI processor 326 through the signal 338. The decision between the two operations of "store only" or accumulate may also depend on the requirement for a separate frequency deinterleaving operation corresponding to a frequency interleaving operation at the transmitter, included in the interleaver 227.

In the foregoing operations, one or more input SQI units 322 are either stored or accumulated at one location or address in the memory 328. In this manner, SQI may be compressed as it is stored in the first memory 328. Stated differently, the input SQI unit 322 is compressed as it is stored in the first memory 328. The first memory stores compressed SQI units. In this embodiment the number of write or store operations is equal to the processed number of units of input SQI 322.

In accordance with the above preferred embodiment of the present invention, the output SQI generator 344 generates the m-th unit of the deinterleaved SQI 360, by reading a memory location from the memory 342, and scaling it by a scaling factor. As stated above, the first memory 328 and the second memory 342 are physically the same memory in some embodiments.

The memory location is identified by the address generated by the second address generator 346 in response to the control signal 352 that includes the value of m provided by the output SQI generator 344 and an address generation request. The scaling factor used in the scaling operation is computed by the output SQI generator 344 based on the value of at least m, L1 and L2. For several values of m, the scaling factor is 1/(L1*L2) when both time and frequency compression are performed by the SQI compression block 324. For other values of m, the output SQI generator 344 may obtain the scaling factor from the SQI processor 326. In various embodiments, the SQI processor 326 provides the scaling factor through the signal 339 to the output SQI generator 344 in response to an address provided by the SQI compression block 344 through the signal 339. The SQI processor 326 obtains the scaling factor as the inverse of the sum of 1 and the number of accumulates after the last store only (i.e. without accumulate) operation at the address provided by the SQI compression block 344. The SQI processor 326 may keep track of the number of accumulates after the last store only by having a memory located therein and counting the number of accumulates after the last store-only operation at some addresses in the first memory 328. This is done especially when the data deinterleaver (246 or 204) is a convolutional type of interleaver and the number of accumulates is kept track for only those memory locations corresponding to those branches whose time delay is smaller than or equal to L1.

When the scaling factor is 1, the scaling operation may be skipped. A given memory location is read multiple times (not necessarily in order) to generate the units of the deinterleaved SQI 360. In this manner, the contents of the memory 342 are expanded as they are read and scaled to generate the deinterleaved SQI 360. In this embodiment, the number of read operations from the second memory 346 is equal to the generated number of units of the deinterleaved SQI 360. The foregoing operations of the SQI compression block 324 and the SQI expansion block 340 together constitute "compressed deinterleaving".

In other embodiments of the invention, the SQI processor 326 may contain its own local memory used to perform accumulate operations on input SQI units 322 before storing or accumulating into the first memory 328. This may be used to reduce the number of write operations to the first memory 328.

In other embodiments of the invention, the output SQI generator 344 may store the result of a scaling operation of the content read from the second memory 342 in its own local memory and repeat the locally stored values multiple times to generate the deinterleaved SQI 360. This may be used to reduce the number of read operations from the second memory 342.

In various other embodiments, the SQI processor 326 may transform the representation of the input SQI units 322 in addition to or in place of the above described operations. In an embodiment, at least one single SQI unit of the input SQI units 322 may be transformed to one single transformed quantity. In another embodiment, multiple input SQI units may be transformed to multiple transformed quantities, wherein the number of input SQI units being transformed may not be equal to the number of transformed quantities. As a result of the transforming operation, the word size used to represent the SQI units may be reduced. Correspondingly an inverse transformation may be performed by the output SQI generator 344 in addition to or in place of the above described operations.

In one embodiment, when the input SQI is the square of the absolute value of the channel gain associated with the data symbol, the internal transformed representation used in the block 324 is the absolute value of the channel gain associated with the data symbol. In an embodiment, this transformation may be done by the SQI processor 326, as it receives the input SQI units 322. In such an embodiment, the output SQI generator performs the inverse transformation as it generates units of the deinterleaved SQI. In another embodiment, the memory 328 stores the square root of the sum of squares of the input SQI 322 in a time and/or frequency coherence interval. In such an embodiment no inverse transformation is performed by the output SQI generator 344.

In various other embodiments, the SQI compression block 324 is configured to perform at least one of a sampling, storing and reading operation at a location in the first memory 328. These operations may be performed by an SQI processor 326 that is coupled to the first memory 328 and to the first address generator 330. The location in the first memory 328 is identified by an address generated by the first address generator 330.

In these embodiments, the SQI expansion block 340 is configured to perform at least one of the following operations: repeating; interpolating and reading, from a plurality of locations in the second memory 342. These operations may be performed by the output SQI generator 344. The plurality of locations in the second memory 342 is identified by a plurality of addresses generated by the second address generator 346.

In an embodiment of the present invention, the SQI processor 326 accepts units of input SQI 322 and discards all but one input SQI unit corresponding to a group of L1*L2 input SQI units (not necessarily in successive order), and stores the one input SQI unit in the first memory 328 at an address generated by the first address generator 330. The address generator 330 generates this address in response to the control signal 332 from the SQI processor 326. Since several units of the input SQI may be discarded, no address generation is performed for these input SQI units. Stated differently the SQI processor 326 in essence, samples the input SQI 322 with a sampling factor of L1*L2 and stores the samples in the first memory 328. In these embodiments, the first and second memories, 330 and 346, are physically the same memory. In one embodiment, the selected unit in the group of L1*L2 input SQI units is at the center or middle of the group in both time and frequency dimensions. In various embodiments, the sampling may not be uniform sampling. The output SQI generator 344 reads a plurality of memory locations identified by a plurality of addresses generated by the second address generator 346 and performs an interpolation operation on the read contents to generate one unit of the deinterleaved output SQI 360. It may also perform a repetition operation. Those skilled in the art will appreciate that repetition operation is a trivial form of interpolation.

In accordance with an embodiment of the present invention, in a multi-carrier system, time compression of the input SQI 322 is done by representing a group of SQI units of a sequence of the units of the input SQI 322 on a given subcarrier but across L1 frames or L1 OFDM symbols spread across time by a single quantity whose value is the result of a function of the SQI units across these frames. Rather than storing the L1 SQI units, one for each of the L1 frames, only a single quantity such as, for example, their sum may be stored, significantly reducing memory size requirements. In one embodiment, the function is an average of the values of L1 SQI units. In yet another embodiment, when L1 is an odd integer number, the value of the SQI unit in the middle of L1 frames is used to represent the group of SQI units and the remaining discarded. When L1 is an even integer either of the two SQI units in the middle of L1 successive frames is used to represent the group of SQI units and the remaining discarded. Frequency compression (that is, compression in the frequency dimension) of input SQI 322 may be done by representing a group of SQI units in a given OFDM frame but across L2 successive sub-carriers by one quantity whose value is the result of a function of the SQI units on these sub-carriers. In an embodiment the function is a sum. In another embodiment the function is the average or mean. This is particularly effective in applications or environments where over a number of successive sub-carriers, the SQI does not change significantly.

In FIGS. 2-5, if the notch in the frequency response remains static or the same, compression may be performed over a longer period of time with no adverse effect on performance; but if the notch is not static, compressing over a long period of time is likely to result in losing information, and may therefore be less desirable.

In one embodiment, the compressed deinterleaver (212 or 264) performs compression jointly in time dimension and in frequency dimension so that one quantity is stored corresponding to a group of SQI units across time and frequency. Stated differently, the compressed deinterleaving step comprises jointly compressing the plurality of input SQI units in time dimension and frequency dimensions, wherein one quantity is stored corresponding to a group of input SQI units across L1 successive frames and L2 successive sub-carriers, the value of this quantity being the result of a function of the SQI units in this group. An expansion operation is then performed on these stored results, the compressed SQI units to generate the deinterleaved SQI.

In one embodiment of the invention the particular function is a simply a summation. In some embodiments, when the data deinterleaver (204 or 246) is a block deinterleaver, the number of SQI units in the group is equal to the product of L1 and L2. In other embodiments, when the data deinterleaver (204 or 246) is a convolutional deinterleaver, the size of group is less than or equal to the product of L1 and L2.

Time/frequency coherence interval estimator 310 and/or time/frequency coherence interval adjustment block 312 provide the values of L1 and L2 in output 316 to the address first generator block 330 and second address generator block 346.

In accordance with one embodiment of the present invention, when the communication system 10 or 20 is an OFDM system, the preliminary frequency coherence interval, L_2, is determined by determining the number of consecutive subcarriers in any given OFDM symbol or frame, over which the units of input SQI do not change significantly. In accordance with an embodiment of the present invention, L_2 is determined as the number of sub-carriers such that ratio of the largest SQI unit to the smallest SQI unit on a given OFDM symbol or frame is less than a design parameter threshold. In accordance with an embodiment of the present invention, the values of L_1 and L_2 may not be constant, but may instead be dynamic. L_1 and L_2 may change within a few OFDM symbols, to a number of the order of a previous L_1, or within a few sub-carriers to a number of the order of a previous L_2. In other embodiments of the present invention, the values of L_1 and L_2 may be chosen to be fixed for long periods of time, on the order of several thousand OFDM frames and for all sub-carriers. The time/frequency coherence interval estimator 310 may already be present within another part of the receiver for performing various other functions, and is therefore shown in dashed lines in FIG. 7.

In accordance with various embodiments of the present invention, the values and the frame and/or sub-carrier index or symbol index when a change in values occurs in L1 and/or L2 is also provided to the SQI compression block 324 and the SQI expansion block 340. These embodiments may be used for example when there is periodic pulse noise in single carrier systems or frequency selective interference in multi-carrier systems.

In accordance with an embodiment of the present invention, when the data deinterleaver is a convolutional deinterleaver, the preliminary time and frequency coherence intervals may be further adjusted by the time/frequency coherence adjustment block 312, such that L_2 may be rounded to the nearest sub-multiple of the total number of data sub-carriers, K, to obtain L2. In other embodiments, L_2 may be rounded to the nearest multiple or sub-multiple of the total number of branches, B to obtain L2. In various embodiments, L_1 is rounded to the nearest sub-multiple of the delay in the longest branch of the conceptual representation of convolutional deinterleaver to obtain L1.

In various embodiments of the invention, when the system is a single-carrier system, the frequency dimension does not exist and hence value of L2 is equal to 1. Stated differently, no frequency compression is performed.

In accordance with an embodiment of the present invention, when the data deinterleaver (204 or 246) is a convolutional deinterleaver and the number of data sub-carriers K equals the number of branches B, the contents of L1 memory elements in a branch of the conceptual representation of convolutional deinterleaver are represented using a single memory element in the compressed deinterleaver block. In various embodiments, when the data deinterleaver (204 or 246) is a convolutional deinterleaver and the number of data sub-carriers K equals the number of branches B, the contents of a set of memory elements across L2 consecutive or successive branches of the conceptual representation of convolutional deinterleaver are represented using a number of memory elements equal to that of the longest branch among the said L2 successive branches.

In accordance with an embodiment of the present invention, the value of L1 may be varied depending on the branch index of the corresponding conceptual representation of the convolutional deinterleaver. In an embodiment, when the data interleaver (204 or 246) is a symbol level convolutional interleaver, L1 may be made equal to the time span in the branch of the corresponding conceptual representation of the deinterleaver, whereby no time history is stored. In an embodiment when the number of data sub-carriers, K, is a multiple of B, L1 may be made equal pursuant to the following:

$$L1 = \text{ceil}(b-1)(M)\left(\frac{B}{K}\right) \quad \text{Eq. (1)}$$

wherein M represents the depth of the deinterleaver and is the difference in the number of memory elements or FIFO size of consecutive branches, B represents the total number of branches, and b is the branch index that varies from 1 to B. In an embodiment, when K is a multiple of B, L1 is made equal to the multiple or sub-multiple of M that is nearest to L_1.

In a multi-carrier communication system where the interleaver 227 is a symbol level block interleaver of A rows and B columns, the data deinterleaver (204 or 246) has a history size of A*B, and may be implemented by writing a block of A*B number of units of the data 202 column-wise into an array of A rows by B columns and generating the output 206 of deinterleaved data symbols by reading from the array row-wise.

If in accordance with an embodiment of the present invention, K is the number of data sub-carriers, and P is the number of OFDM symbols over which a block of A*B data symbols span, such that K*P=A*B, and such that K is a multiple of A which also implies that B is a multiple of P, the compressed deinterleaver is as described below. The block 324 may write or accumulate the n-th unit in a sequence of units of the input SQI 322 to the content at the memory address or location, pursuant to Eq. (2) below, which may be the address generated by the first address generator 330 according to the following equation:

$$\frac{K}{L2}\left(\text{mod}\left(\text{floor}\left(\frac{\text{floor}\left(\frac{n-1}{K}\right)}{L1}\right), P\right) + \text{floor}\left(\frac{\text{mod}(n-1, K)}{L2}\right) + 1 \quad \text{Eq. (2)}$$

The index n varies from 1 through A*B. The address or location above varies from 1 to A*B/(L1*L2). The above equations are applicable in an embodiment where the symbols at the transmitter are written first in sub-carrier first and then in OFDM symbols next. Stated differently, in such embodiment, the transmitter first uses all the sub-carriers in an OFDM symbol before using the sub-carriers of the next OFDM symbol. In accordance with alternative embodiments of the present invention, this may occur in a different sequence, and one having reasonable skill in the art will realize that the above equations can be modified accordingly.

In accordance with an embodiment of the present invention, the SQI processor 326 may also generate an accumulate_decision, which decides whether to accumulate or not. When the accumulate_decision is FALSE or NO or 0, the n-th unit (or value) of input SQI may be written in the memory 328 at the address given by Eq. (2). The accumulate_decision is obtained based on the value of n. Writing or storing of this input SQI overwrites any previous memory contents. When the accumulate_decision is TRUE or YES or 1, the n-th SQI unit (or value) is added to the contents of the memory address given by Eq. (2), and the result is written back to the same memory location.

In accordance with an embodiment of the present invention, block deinterleavers may use two separate memory banks or blocks, in a ping pong fashion, so that input and output may be handled at the same time. In such a configuration, the memory 328 or 342 includes two memory banks, one bank used for writing to the memory 328 or 342 and the other memory bank for reading from the memory 342 or 328. Further, in such a configuration, the two banks may be alternated periodically, and the first address generator block 330 indicates to the SQI processor 326 which memory bank to select as part of the signal 334. Thus, the address and control signal 334 may include the memory bank or block selection indication, in addition to the memory address the location at which to "write/store only" or accumulate the incoming unit of input SQI.

In accordance with alternative embodiments of the present invention, the same operations may be performed in a different manner to obtain the same content of the memory 328 or 342. In such an embodiment, the contents of the memory 328 or 342 obtained above can be scaled, truncated, or rounded so as to represent it using word size W5.

The second address generator 346 may provide the following address from which the content is read to generate the m-th unit of the deinterleaved SQI 360 as follows. First the input index n corresponding to the m-th unit of the output is obtained according to the following equation:

$$n_m = A * \text{floor}\left(\frac{m-1}{B}\right) + \text{mod}(m-1, A) + 1 \quad \text{Eq. (3)}$$

Then Eq. (2), previously used by address generator 330, is executed with the $n_m$ value derived from Eq. (3) in place of n. The foregoing operations are performed by the second address generator. The value of m is provided by the output SQI generator in signal 352. The generated address 354 is provided back to the output SQI generator.

In accordance with an alternative embodiment of the present invention, the total amount of memory allocated for the compressed deinterleaver is fixed, and the values of L1 and L2 are selected so as to match the available memory together in conjunction with the values of L_1 and L_2.

In an embodiment of the present invention, when a frequency domain interleaver is employed in addition to the interleaver(s) of interest at the transmitter, the first address generator and the second address generator perform the mapping necessary to account for the presence of the frequency domain interleaver.

Figure 8:
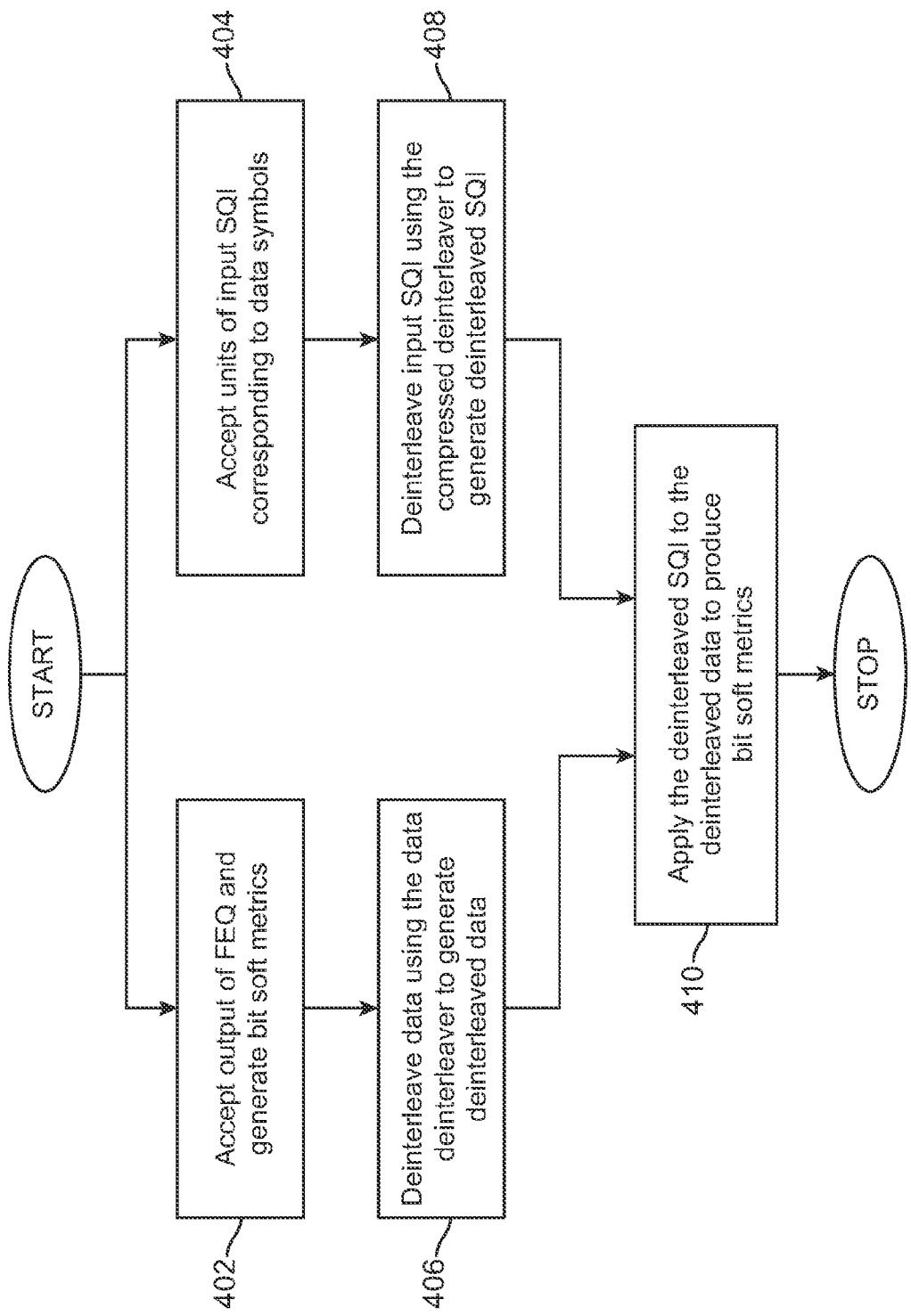
FIG. 8 shows a flowchart of the steps for performing deinterleaving by the receiver, in accordance with a method of the present invention.

FIG. 8 shows a flowchart of the steps for performing deinterleaving by the receiver 14 or 24, in accordance with a method of the present invention, where the interleaver at the transmitter is a bit interleaver. Those skilled in the art will appreciate that in a multi-carrier communication system, such as one utilizing OFDM, the received symbols on the data sub-carriers are generally first passed through an FEQ block.

In accordance with an embodiment of the present invention, at step 402, the FEQ output is used to generate bit soft metrics. These bit soft metrics are generated without knowledge of or ignoring SQI and instead all data symbols at the output of the FEQ may be treated as having the same SQI. Bit soft metrics generated at step 402 by the bit soft metric generator 242 (of FIG. 6) are used at step 406. Step 404 is performed concurrently with step 402. At least one unit of input SQI 262 corresponds to at least one data symbol at the input of the FEQ. At step 406, the data units 244 are deinterleaved by data deinterleaver 246 to generate the deinterleaved data units 248. Following step 404, at step 408, the input SQI units 262 is deinterleaved to produce a the deinterleaved SQI units 266 using a compressed deinterleaving process. An average of S units of deinterleaved SQI 266 are output for every unit of input SQI 262, where S is the number of bits per symbol of the constellation.

In accordance with alternative embodiments of the present invention, when a frequency domain interleaver is additionally included in the interleaver 227, the compressed deinterleaving process also accounts for the presence of the frequency domain interleaver.

At step 406, following step 402, the data units are deinterleaved to produce units of deinterleaved data 248. Step 406 may be performed concurrently with step 408.

At step 410, following steps 406 and 408, the deinterleaved SQI 266, output of the compressed deinterleaving process, may be applied to the deinterleaved data 248, which is generated at step 406, to generate bit soft metrics 252 by the bit soft metric generator 250. The bit soft metrics may be similar to the output of a conventional bit deinterleaver, yet the memory requirements of the various embodiments of the present invention are significantly and advantageously less than that of conventional bit deinterleavers.

The foregoing steps repeat until all the data symbols are exhausted or a termination signal is received. Those skilled in the art will appreciate that these bit soft metrics are fed to a subsequent FEC decoder.

Where the data interleaver is a bit interleaver or symbol interleaver, the average number of bit soft metrics fed to the FEC decoder for every FEQ output or input symbol is S.

Figure 9:
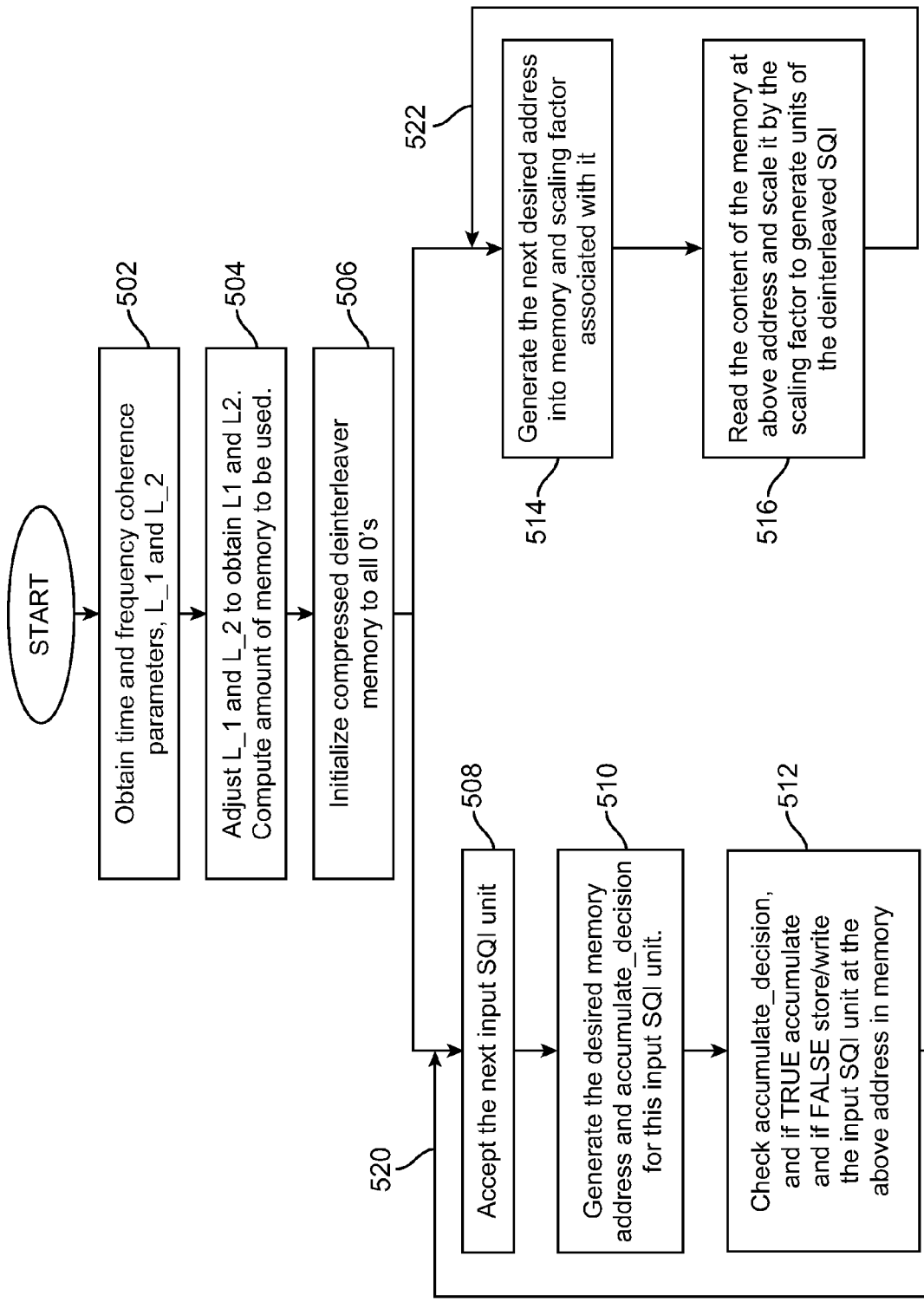
FIG. 9 shows a flowchart of the steps performed for compressed deinterleaving of the input SQI units, by the compressed deinterleaver of FIGS. 1 and 6, in accordance with a method of the present invention.

FIG. 9 shows a flowchart of the steps performed for compressed deinterleaving of the input SQI units, by the compressed deinterleaver of FIGS. 1 and 6, in accordance with a method of the present invention. As previously noted, the compressed deinterleaving process causes the generation of deinterleaved SQI units 226 using the compressed deinterleaver 212 when at least one of the data units is a symbol and when the number of data sub-carriers, K, is a multiple of the number of branches, B, of the convolutional interleaver. In this embodiment, the compressed deinterleaver first memory 328 and the second memory 342 are the same and hereinafter referred to as "compressed deinterleaver memory". In this embodiment, during the compressed deinterleaving step, time and frequency compression of input SQI is performed by the compressed deinterleaver 212 without transforming the representation of the individual units of the input SQI prior to time and frequency compression. At least one unit of the input SQI units processed by the compressed deinterleaver corresponds to at least one unit of the data units processed by the data deinterleaver 204.

In one embodiment, at least one input SQI unit corresponds to one data unit. In another embodiment, at least one input SQI unit corresponds to more than one data unit. In yet another embodiment at least one input SQI unit does not correspond to any data unit. In such an embodiment, however, the deinterleaved SQI units correspond to the deinterleaved data units. In other embodiments, at least one of the data units does not have a corresponding SQI unit in the input SQI units. In one embodiment of the invention, the order of the data units of the input data 202 is sub-carriers first, and OFDM symbols second, i.e. all the received symbols on the sub-carriers of a given OFDM symbol or frame are first input to the data deinterleaver 204, before processing the next OFDM symbol or frame.

At step 502, values L_1 and L_2 are obtained and are assumed to be constant (i.e. do not vary across time/frequency) by the time/frequency coherence interval estimator 310. In accordance with alternative embodiments of the present invention, and as discussed above, L_1 and L_2 may not always be fixed, but can vary over time/frequency. At step 504, L_1 may be adjusted, by the time/frequency coherence interval adjustment block 312, for example by rounding to the nearest multiple or sub-multiple of the depth, M, of the convolutional interleaver, to obtain L1. The value of L1 may be further adjusted as explained below. Similarly, L_2 is adjusted, for example by rounding to the nearest multiple or strict sub-multiple of the number of branches, B, of the convolutional deinterleaver to obtain L2. The value of L2 may be further adjusted as explained below.

Those skilled in the art will appreciate that various equations presented below can be derived for a given choice of organization in the memory, by using careful algebra based on the notion of compression across time and/or frequency, and the process of accumulation during compression and the need for scaling appropriately during expansion, in order to compensate for the change to the SQI during the accumulation process. Those skilled in the art will further appreciate that the memory may be organized in several different ways which results in different sets of equations. The equations presented below are presented as exemplary methods of performing compressed deinterleaving.

In accordance with an embodiment of the present invention, if L_2 is a multiple of B, no further adjustments are made to it, and the number of memory elements needed for the compressed deinterleaver is determined as Q2=Q1/(L1*L2/2). Here Q1 is given by M*B* (B−1)/2.

The following notation is used to denote the sum of a series of terms T(i) as the integer i varies from 0 to another integer R:

$$\sum_{i=0}^{R} T(i).$$

Note that T(i) implies that T is a function of i.

In accordance with an embodiment of the present invention, if L2 is a strict sub-multiple of B, the number of memory elements used for the compressed deinterleaver is, instead, determined as:

$$Q2 = \text{Conv\_mem}(L1, L2) \qquad \text{Eq. (4)}$$

$$= M/L1 * \sum_{i=0}^{B/L2-1} (B - iL2 - 1)$$

$$= M/L1 * (B - 1 + (B/L2 - 1) * B/2)$$

$$= M * B/(L1 * L2) * ((B + L2)/2 - 1)$$

In various embodiments, the amount of memory available, Q2_avail, to implement the deinterleaver is dictated also based on other factors independent of L1 and L2. In such cases the above values of L1 and L2 may be further adjusted (increased or decreased) so as to make Q2 (recomputed based on adjusted values of L1 and L2) as close as possible to the available memory, Q2_avail but not larger than it. Stated differently, the values of L1 and L2 are adjusted so as to make Q2<=Q2_avail.

In various other embodiments of the invention, values of L_1 and L_2 are not obtained and no adjustment is done on them to obtain L1 and L2. Instead L1 and L2 are chosen as design parameters. In this embodiment step 502 is absent.

Steps 508, 510 and 512 together comprise input processing loop or compression loop 520. Steps 514 and 516 together comprise output generation loop or expansion loop 522. In accordance with an embodiment of the present invention, following the initialization of the memory to 0's at step 506, by the SQI processor 326, using address and control signal 327, compression loop 520 and expansion loop 522 may begin simultaneously. In accordance with an alternative embodiment of the present invention, the output generation loop 522 may begin after Q1 input SQI units are processed in input processing loop 520, and thereafter the steps of input processing loop 520 and output generation loop 522 may occur simultaneously, substantially simultaneously or in parallel; or the steps of input processing loop 520 and output generation loop 522 may work in an alternating manner or substantially alternating manner. The alternating may occur at every SQI unit or after a multiple number of SQI units. In accordance with still other embodiments of the present invention, the steps of input processing loop 520 and output generation loop 522 may proceed in a time-multiplexed fashion.

At step 508, the units of SQI are accepted as input by the SQI processor 326. Next, at step 510, the desired address is generated into memory 328, by the first address generator 330, and corresponding to the n-th unit of input SQI. Also, at step 510, an accumulate_decision for the n-th unit of the input SQI unit is generated by the SQI processor 326.

Next, at step 512, the input SQI unit may be either accumulated or written at the generated memory address by the SQI processor 326. If accumulate_decision is true, or affirmed, or yes, or 1, the input SQI unit is accumulated at the generated address; otherwise, the input SQI unit is written at that address, possibly overwriting previous content. The accumulation operation comprises reading the content of the memory location identified by the generated address, adding the value of the input SQI unit to this, and storing the result of the addition back into the same location in the memory.

In various embodiments step 506 is not performed. Instead the accumulate_decision at step 510 is modified to achieve the same end effect. Those skilled in the art can see that storing/writing an SQI unit at an address in memory is equivalent to initializing the value at the memory address to 0 then accumulating that value by the SQI unit.

In accordance with an embodiment of the present invention, when K=B, the address signal 334 corresponding to the n-th unit of input SQI is obtained as:

$$\text{floor}(\text{mod}(n-1, K)/B) * M * B/(L1*L2) * ((B+L2)/2 - 1) + \qquad \text{Eq. (5)}$$
$$M/L1 * (\text{floor}(\text{mod}(n-1, B)/L2)) *$$
$$(B - (\text{floor}(\text{mod}(n-1, B)/L2) - 1) * L2/2 - 1) +$$
$$\text{mod}(\text{floor}((\text{floor}((n-1)/K)/L1),$$
$$M/L1 * (B - (\text{floor}(\text{mod}(n-1, B)/L2)) * L2 - 1)) + 1$$

and the accumulate_decision is obtained as:

$$\text{accumulate\_decision} = 0 \text{ if floor}((n-1)/K) \text{ is an integer} \qquad \text{Eq. (6)}$$
$$\text{multiple of } L1 \text{ and } n-1 \text{ is}$$
$$\text{an integer multiple of } L2$$
$$= 1 \text{ otherwise};$$

In accordance with an embodiment of the present invention, the memory address obtained above may be limited to the memory computed or available if the obtained memory address exceeds the memory computed or available.

The accumulation operation creates the quantities that store the SQI units in a compressed form, which are updated as n increases. Control then goes back to step 508 and the process may repeat until all the inputs are exhausted or a terminate control signal is until all the inputs are exhausted or a terminate control signal is given to the compressed deinterleaver 212/264.

In accordance with an embodiment of the present invention, steps 510, 512, 514, and 516 may be skipped whenever the branch index b=1 and the unit of input SQI is directly passed to the output to generate the unit of deinterleaved SQI.

Steps 514 and 516 together comprise output generation loop or expansion loop 522, and show how output of the compressed deinterleaver may be obtained. At step 514, the desired memory address is generated, by the second address generator 346, in order to generate the m-th unit of deinterleaved SQI. This may occur as follows. First the index of the unit of input SQI, $n_m$, which corresponds to the m-th unit of deinterleaved SQI may be obtained as:

$$n_m = m + \text{mod}(m-1, B)(M)(B) - (B-1)(M) \qquad \text{Eq. (7)}$$

Then the desired memory address may be obtained as described in Eq. (2), for this $n_m$. The content 350 of the memory at this address may be provided to the output SQI generator 344 by a second memory 342. At step 514 a scaling factor may also be generated, by the output SQI generator 344, corresponding to the m-th unit of the deinterleaved SQI and associated with the desired memory address. In various embodiments, the scaling factor is obtained by adding one to the number of accumulate operations performed at the desired address since the last store only (i.e. without accumulate) operation and taking the inverse of the result of the addition. The number of such accumulate operations are kept track of for every memory location. In various embodiments, the scaling factor is set to L1*L2 for most memory locations, except to those corresponding to branch indices such that the time delay is less than or equal to L1. Hence the scaling factor is kept track of only for those memory locations corresponding to such a branch index. The time delay of a branch index, b may be given by (b-1)*M*B/K.

Next, at step 516, the contents of the memory at the location identified by the memory address generated above may be read, by the output SQI generator 344, and then scaled by the associated scaling factor to generate a unit of the deinterleaved SQI.

In various embodiments, the same memory address is generated multiple times not necessarily one after the other. Hence the same memory content is read multiple times in order to generate the units of the deinterleaved SQI. Stated differently, the contents of the memory are expanded in time and/or frequency to generate the plurality of deinterleaved SQI units.

The steps 514 and 516 may again repeat, just as steps 508, 510 and 512 repeat, until all the inputs are exhausted or a terminate control signal is given to the compressed deinterleaver 212/264.

At any given time, the compressed deinterleaver stores a smaller number of units than the number of data units stored by the data deinterleaver. In accordance with an embodiment of the present invention, when L2=B, and L1 is a sub-multiple of M, the memory required in the compressed deinterleaver is given by using the value of L2=B in Eq. (4) to obtain the following:

$$\frac{M}{L1}(B-1) = \frac{Q1}{\frac{(L1)(L2)}{2}} \qquad \text{Eq. (8)}$$

Stated differently, at any given time, the number of data units stored in the data deinterleaver is Q1 and the number of compressed SQI units stored in the compressed deinterleaver is given by Eq. (8), when L2=B.

As shown in Eq. (8), the reduction in memory due to frequency compression is a factor of L2/2, and due to time compression is by a factor of L1. This is valid as long as K is a multiple of B. The values of L1 and L2 whenever compression is used are such that (L1)(L2)/2>1. Hence at any given time, the compressed deinterleaver stores a smaller number of compressed SQI units than the number of data units stored by the data deinterleaver.

When L2 is less than B and is sub-multiple of B a reduction in the memory greater than the above factor can be achieved. For example in the DTMB standard, parameters of the convolutional interleaver are B=52, M=720. The number of memory locations required by the convolutional deinterleaver is Q1=M*B*(B-1)/2=954720. With L1=8, and L2=13, Eq. (4) gives Q2=811340 which is a reduction by a factor of approximately 84. This is achieved by the use of complex logic in the accumulation, scaling and address generation as described above.

In the presence of a additional frequency domain deinterleaver which is the case for example in DTMB multi-carrier mode, the above equations need to be modified and the equations and logic become even more complex to derive. In order to avoid this, other embodiments such as those described below may be used. In various embodiments of the invention, when the communication system in a multi-carrier system and the data deinterleaver is a convolutional deinterleaver, the compressed deinterleaver stores a number of results or quantities equal to ceil (T/L1)*ceil((J+K)/L2) and performs compression as done for a block deinterleaver. Here T is the total time span in frames of the deinterleaver and is given by ceil(M*B*(B-1)/K). Here J is non-negative integer number which denotes the number of sub-carriers in addition to the data sub-carriers of interest the SQI units corresponding to which are also included in the plurality of the input SQI units. The compressed deinterleaver also processes the SQI corresponding to these J sub-carriers although they do not correspond to the data units. Stated differently, at least one unit of the plurality of input SQI units does not correspond to any unit of the plurality of data units. However the deinterleaved SQI units correspond to the deinterleaved data units and are exactly equal in number. In an embodiment the J sub-carriers together with the K data sub-carriers form all the sub-carriers and hence (J+K) is the total number of sub-carriers in the system. The SQI compression operation proceeds like that of a block deinterleaver and is hence simplified. In an embodiment, the SQI expansion block reads the content of memory at only those locations where the read contents after scaling correspond to the deinterleaved data units, although the memory contains more locations than are needed by the expansion block. In various embodiments these extra memory locations can be removed by considering the properties of the frequency domain interleaver, whereby the memory is reduced without significantly affecting the complexity. In an embodiment, the time delay corresponding to the branch, and the sub-carrier index of the data unit of the plurality of the deinterleaved data units for which the desired SQI unit of the plurality of deinterleaved SQI units corresponds is obtained. Given this sub-carrier index and the time delay and the values of L1, L2, and T, one skilled in the art can with some algebra easily obtain the address offset with respect to the write address of the SQI compression block. One skilled in the art will also appreciate that T is identical to the quantity P in Eq. (2). Together with this offset and the write address of the SQI compression block which is identical to that of a block interleaver, the memory address required for the SQI expansion loop is obtained. In various embodiments, the address generation by the first and by the second address generator includes a frequency deinterleaving operation. In various embodiments when the transmitter employs an additional frequency domain interleaver, the sub-carrier index used in the address generation logic is obtained based on a frequency deinterleaver look up table or mapping such that the frequency domain interleaving operation at the transmitter is reversed.

In an exemplary embodiment, when the first and second address generators 330 and 346 of FIG. 7 also perform a frequency deinterleaving operation corresponding to a frequency interleaving operation performed by the interleaver 227, the memory size saving of the compressed deinterleaver has been realized to be a factor of 18. Stated differently, the memory size required for SQI deinterleaving as a result of using the compressed deinterleaver, of the various embodiments of the present invention, is reduced to approximately 6%, or by approximately 94%.

Figure 10:
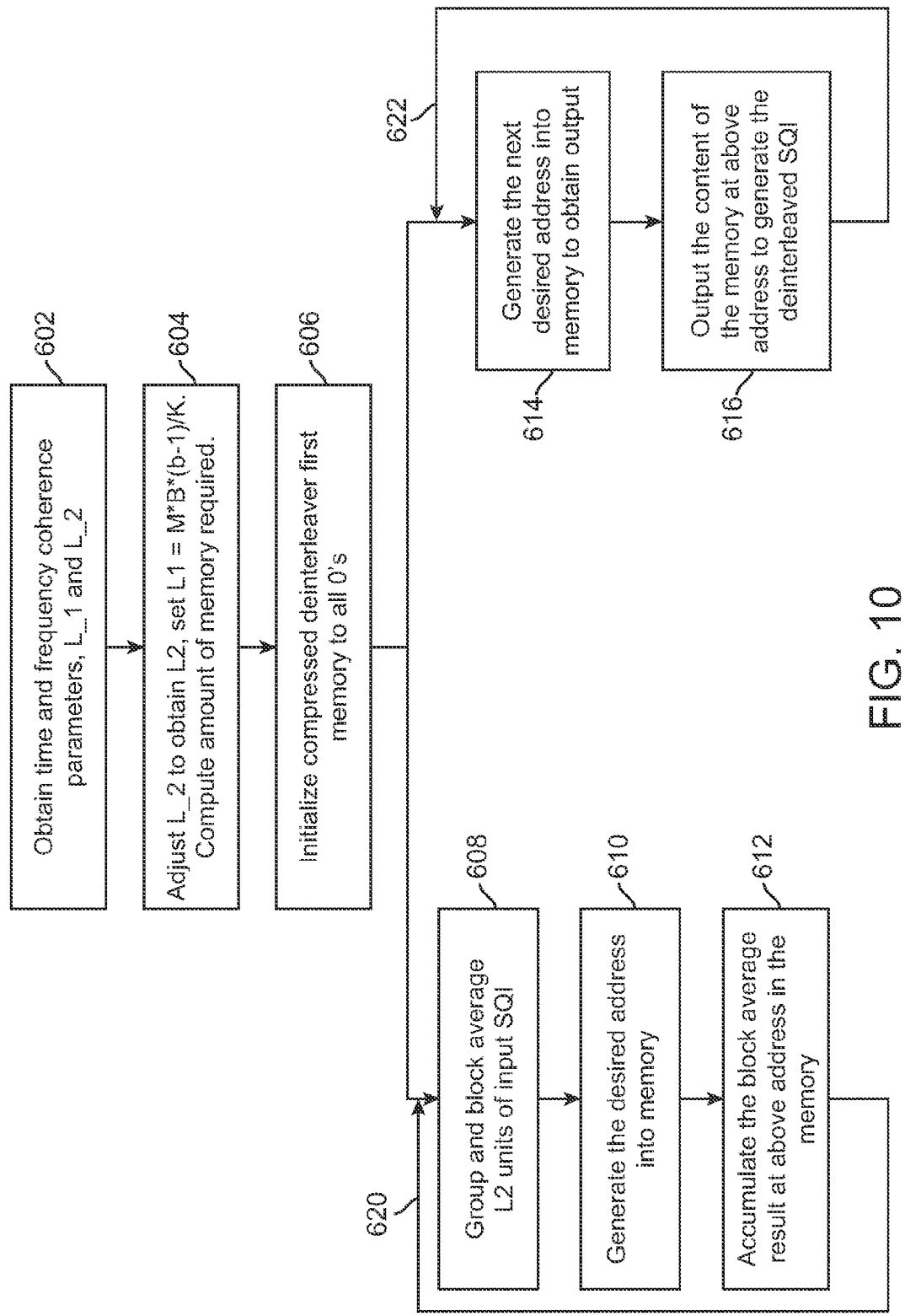
FIG. 10 shows a flowchart of the steps performed for compressed deinterleaving, by the compressed deinterleaver of FIGS. 1 and 6, in accordance with a method of the present invention.

FIG. 10 shows a flowchart of the steps performed for compressed deinterleaving, by the compressed deinterleaver of FIGS. 1 and 6, in accordance with a method of the present invention. The flowchart of these steps for a compressed deinterleaver of FIG. 10 may be employed where the data deinterleaver 204/246 is a symbol level convolutional deinterleaver, the communication system is an OFDM system, the number of data sub-carriers, K, is a multiple of the number of branches of the convolutional deinterleaver, B, and the product, M*B is a multiple of K.

At step 602, the preliminary frequency coherence parameter, L_2, may be obtained from the time/frequency coherence interval estimator 310. At step 602, the preliminary time coherence parameter, L_1, also may be obtained from the time/frequency coherence interval estimator 310. In accordance with an alternative embodiment of the present invention, the preliminary time coherence parameter (L_1) may not be obtained, or may be obtained and then overwritten at step 604 by the time/frequency coherence interval adjustment block 312. If not obtained, or obtained and then overwritten, at step 604 the preliminary time coherence parameter (L_1)

may then be adjusted, by the time/frequency coherence interval adjustment block 312, to M*(b−1)*B/K to obtain L1. Therefore the adjusted time coherence interval estimate L1, may vary with the branch index, b. The branch index is obtained as b=floor((k−1)/B)+1, where k is the data sub-carrier index (starting from 1). The branch size of the b-th branch is given by M*(b−1). At step 604, the value of L_2 may also be adjusted to obtain L2. In accordance with an embodiment of the present invention, the adjustment may simply be a rounding operation to the nearest multiple or sub-multiple of B. In accordance with an alternative embodiment of the present invention, the adjustment may be a flooring operation to the nearest sub-multiple of B. In either of these embodiments, the amount of memory required for the compressed deinterleaver is obtained as K/L2.

It is a benefit of the present invention that L2 may be advantageously configured using a variety of methods. In accordance with yet another embodiment of the present invention, two values of L2 may be used. The first value of L2 may be equal to L_2. The second value, L2', may be set to B−floor(B/L2)*L2 when L_2 is less than B; or, alternatively, L2' may be set to B*floor(L2/B)−L2 when L_2 is larger than B. When L_2 is less than B, frequency compression may be performed across L2 successive sub-carriers, up to sub-carrier index floor (B/L2)*L2. The remaining L2' sub-carriers may be compressed into a single value at a later step. In such an embodiment, the amount of memory required for the compressed deinterleaver may be obtained as ceil (B/L2)*K/B. In accordance with an embodiment of the present invention, the value of L2 may be selected by also considering the depth M, and the Doppler spread or time coherence estimate of the channel. As the depth and/or the Doppler spread of the channel becomes greater, a smaller value may be selected for L2. This may result in a value of L2 being chosen as a sub-multiple of B, even if L_2 was larger than B. Since L1 is chosen to be independent of the Doppler spread or time coherence of the channel, having smaller values of L2, allows storing more values as the SQI changes, not just across frequency but also across time. After L2 is obtained, and the required memory computed, the process proceeds to step 606.

In accordance with an embodiment of the present invention, at step 606 the amount of memory determined necessary at step 604 is initialized to all 0's by the SQI processor 326, using the address and control signal 327. At step 608, L2 units of input SQI are grouped and averaged by the SQI processor 326 (e.g., block average). In an embodiment, the L2 units of input SQI are grouped and summed. In yet another embodiment only one SQI unit among the group of L2 units of input SQI is chosen and the remaining discarded.

In an embodiment when the transmitter uses a frequency domain interleaver, the L2 units of SQI that are grouped for the purpose of compressed deinterleaving may not be in successive order. In such an embodiment, the physical order of sub-carriers is different from the order of the input SQI units and this ordering is reversed during grouping so that the SQI units that correspond to successive L2 sub-carriers are grouped together, rather than grouping successive L2 SQI units. The unit of input SQI is referred to as input_SQI(k,p), where k is the sub-carrier index, and p is the OFDM symbol index. Next, at step 610, the desired address is generated by the first address generator 330. The memory address may be obtained as floor ((k−1)/L2)+1, where the memory addresses start from 1. It should be noted that this value may not change with every k, but instead across groups of L2 units of input SQI (within which averaging is done at step 608). The quantity k can be obtained as mod(n−1, K)+1, where n is the index of the input SQI unit.

At step 612, the result of step 608 is accumulated at the memory location, by the SQI processor 326, identified by the address obtained at step 610, from the first address generator 330. In accordance with one embodiment of the present invention, the accumulation may be done using an infinite impulse response (IIR) filter averaging method, as shown by Eq. (9):

$$\text{new\_mem\_content} = \text{old\_mem\_content} * \text{alpha} + (1-\text{alpha}) * \text{avg\_input\_SQI\_unit} \qquad \text{Eq. (9)}$$

In Eq. (9), avg_input_SQI_unit is the result from step 608, old_mem_content is the previous content of the memory at the location determined at step 610, and new_mem_content is the new accumulated value. The quantity new_mem_content is written back to the memory at the same location. In accordance with an embodiment of the present invention, the quantity alpha is a design parameter, which may be a function of floor ((b−1)/L2)+1. In such embodiments, there is no memory across time and the value of L1 may be M*(b−1)*B/K. It should be noted that that L1 may change with every change in branch index, but the value of alpha may change only across groups of L2 values of b.

In accordance with another embodiment of the present invention, the IIR averaging parameter, alpha, may be made a function of the branch index of the deinterleaver, whereby as the branch index becomes larger, alpha may become larger as well. This may be especially when the value of L2 is 1. When b is greater than 1, new_mem_content may be defined according to Eq. (10):

$$\text{new\_mem\_content} = \text{old\_mem\_content} * \min(1-1/(M*(b-1)), \text{beta}) + \text{input\_SQI\_unit} \qquad \text{Eq. (10)}$$

Alternatively, when b is equal to 1, new_mem_content may be defined according to equation 11:

$$\text{new\_mem\_content} = \text{old\_mem\_content} * \text{beta} + \text{input\_SQI\_unit} \qquad \text{Eq. (11)}$$

As explained above, in accordance with an embodiment of the present invention, b=floor((k−1)/B)+1, where k is the data sub-carrier index starting from 1. In accordance with alternative embodiments of the present invention, the branch index may be derived using a mapping function determined by a frequency domain interleaver at the transmitter. Beta may equal 0; beta may be chosen based on the quality or accuracy of the input SQI, or the SINR of the system; or the value of L_1 may also be used to determine beta.

Steps 614 and 616 show how the output of the compressed deinterleaver block 212 or 264 is obtained. At step 614, the next desired memory address is generated by the second address generator 346, to obtain the m-th unit of deinterleaved SQI. The address to obtain the m-th deinterleaved SQI unit may be obtained from Eq. (12):

$$\text{floor}(\text{mod}(m-1+\text{mod}(m-1,B)*M*B,K)/L2)+1 \qquad \text{Eq. (12)}$$

where m starts from 1.

At step 616, the content of the memory at this address may be read by the output SQI generator 344, to generate the deinterleaved SQI unit. The steps 614 and 616 may again repeat, just as steps 608, 610, and 612 repeat, until all the inputs are exhausted or a terminate control signal is provided to the compressed deinterleaver 212/264.

In accordance with an embodiment of the present invention, whenever b=1, steps 614 and 616 may be skipped, and the incoming unit of input SQI may instead be simply used as the unit of deinterleaved SQI.

In the embodiment shown in FIG. 10, where symbol deinterleaving is used in a DTMB system, for a TU6 type channel, discussed in COST207, Digital land mobile radio communications (final report), Commission of the European Communities, Directorate General Telecommunications, Information Industries and Innovation, 1989, pp. 135 147, the memory size saving of the compressed deinterleaver has been realized to be a factor greater than 100 with small performance loss. Stated differently, the memory size of the compressed deinterleaver has been reduced by approximately 99% with only a small performance loss.

Any function or operation of the compressed deinterleaving may be performed in hardware or software or a combination of the two. Additionally, reference to a "block" or "block" is no indication of the physical implementation of the block, as a block or blocks may be implemented in hardware or software or a combination of the two. It may also refer to memory module.

The hardware implementation of any function, operation or block described above, including any logic or transistor circuit, may be generated automatically by computer based on a description of the hardware expressed in the syntax and the semantics of a hardware description language, as known by those skilled in the art. Applicable hardware description languages include those provided at the layout, circuit netlist, register transfer, and schematic capture levels. Examples of hardware description languages include GDS II and OASIS (layout level), various SPICE languages and IBIS (circuit netlist level), Verilog and VHDL (register transfer level), and Virtuoso custom design language and Design Architecture-IC custom design language (schematic capture level). The hardware description may also be used, for example, in various behavior, logic and circuit modeling and simulation purposes.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of deinterleaving in a communication system that uses a communication channel, the method comprising:
   deinterleaving a plurality of data units using a data deinterleaver to generate a plurality of deinterleaved data units;
   compressed deinterleaving a plurality of input symbol quality information (SQI) units to generate a plurality of deinterleaved SQI units by a compressed deinterleaver, wherein at least one unit of the plurality of input SQI units corresponds to at least one unit of the plurality of data units and applying the deinterleaved SQI units to the corresponding deinterleaved data units to produce soft bit metrics, wherein at any given time, the compressed deinterleaver stores a smaller number of compressed SQI units than the number of data units stored by the data deinterleaver.

2. The method of deinterleaving of claim 1, wherein the compressed deinterleaving includes an averaging or summing operation whereby SQI estimation error is reduced and performance of the receiver is improved.

3. The method of deinterleaving of claim 1, wherein the deinterleaving of the plurality of data units and the compressed deinterleaving are performed simultaneously or substantially simultaneously.

4. The method of deinterleaving of claim 1, wherein the deinterleaving of the plurality of data units and the compressed deinterleaving are performed in an alternating manner.

5. The method of deinterleaving of claim 1, wherein the deinterleaving of the plurality of data units and the compressed deinterleaving are performed at a symbol level and at least one of the plurality of data units is a symbol.

6. The method of deinterleaving of claim 1, wherein at least one of the plurality of data units is a bit soft metric.

7. The method of deinterleaving of claim 1, wherein during the compressed deinterleaving step, at least one of the steps of compressing the plurality of input SQI units in time dimension, compressing the plurality of input SQI units in frequency dimension, and transforming the representation is performed, and further storing the result thereof and performing an expansion operation on the stored result, wherein the stored result comprises the plurality of compressed SQI units.

8. The method of deinterleaving of claim 7, wherein the expansion operation comprises at least one of a read operation of at least one stored result, an inverse transforming operation on the at least one stored result, a scaling operation by a scaling factor, and a repetition operation.

9. The method of deinterleaving of claim 7, wherein the expansion operation comprises a read operation of at least two stored results, and at least one of a inverse transforming operation on the at least two stored results, an interpolation operation and a repetition operation.

10. The method of deinterleaving of claim 7, wherein storing of the results when compressing in time dimension further comprises evaluating a function of a group of L1 input SQI units included in the plurality of the input SQI units, wherein L1 is an integer number that is greater than one, and storing the result of the function as one quantity corresponding to the group of L1 input SQI units.

11. The method of deinterleaving of claim 10, wherein the result of the function is a sum of the group of L1 input SQI units.

12. The method of deinterleaving of claim 10, wherein the result of the function is the input SQI unit in the middle of the group of the L1 input SQI units, when L1 is an odd integer number, and the result of the function is one of the two input SQI units in the middle of the group of the L1 input SQI units, when L1 is an even integer number.

13. The method of deinterleaving of claim 12, wherein the value of L1 is based on a time coherence interval estimate of the communication channel.

14. The method of deinterleaving of claim 10, wherein the data deinterleaver is a convolutional deinterleaver having a total of B number of branches, B being an integer number greater than one and each of the data units corresponding to a branch having a branch size and the value of L1 being set equal to the branch size of the branch of the data unit to which the input SQI unit corresponds, times B divided by K, K being the number of data sub-carriers in the communication system.

15. The method of deinterleaving of claim 7, wherein storing of the results when compressing in frequency dimension further comprises, evaluating a function of a group of L2 input SQI units included in the plurality of input SQI units, wherein L2 is an integer number that is greater than one, and storing the result of the function as one quantity corresponding to the group of L2 input SQI.

16. The method of claim 15, wherein the communication system is a multi-carrier system, the data deinterleaver is a convolutional deinterleaver, and the compressed deinterleaver stores a number of quantities no less than the product of the total number of data sub-carriers and the time span of the data deinterleaver in frames divided by the product of L1 and L2.

17. The method of deinterleaving of claim 15, wherein the value of L2 is based on a frequency coherence interval estimate of the communication channel.

18. The method of deinterleaving of claim 1, wherein the compressed deinterleaving is performed by using a transformed representation of at least one of the plurality of input SQI units, wherein the transformed representation allows use of smaller word size than that used for the input SQI units.

19. The method of deinterleaving of claim 1, wherein the compressed deinterleaving step further comprises jointly compressing the plurality of input SQI units, in time and frequency dimensions and storing the result of the joint compression and performing an expansion operation on the stored result.

20. The method of deinterleaving of claim 19, wherein storing of the results when compressing jointly in frequency and time dimensions further comprises, evaluating a function of a group of a maximum size of the product of L1 and L2 input SQI units included in the plurality of input SQI units, with L1 and L2 each being an integer number and each being greater than one, and storing the result of the function as one quantity corresponding to the group of input SQI units.

21. The method of deinterleaving of claim 1, wherein one of the plurality of the input SQI unit's correspondence to a data unit is a signal to noise and interference ratio (SINR) associated with the data unit.

22. The method of claim 1, wherein said soft bit metric is a metric that indicates the likelihood that a bit is a value '1' or a value '0'.

23. A deinterleaver for use in a communication system comprising:
a data deinterleaver configured to deinterleave a plurality of data units; and
a compressed deinterleaver configured to deinterleave a plurality of input symbol quality information (SQI) units, wherein at least one unit of the plurality of input SQI units corresponds to at least one unit of the plurality of data units, and the compressed deinterleaver is configured to compress the plurality of SQI units to generate a plurality of compressed SQI units, to store the compressed SQI units and to perform an expansion operation on the stored compressed SQI units to generate a plurality of deinterleaved SQI units, wherein the deinterleaved SOI units are used to generate soft bit metrics, wherein at any given time, the compressed deinterleaver stores a smaller number of compressed SQI units than the number of data units stored by the data deinterleaver.

24. The deinterleaver of claim 23, wherein the compressed deinterleaver comprises:
a first address generator configured to generate a first address identifying a location in a first memory, a SQI compression block responsive to input SQI units and configured to perform at least one of storing, reading, and accumulating operations at the location identified by the first address;
a second address generator configured to generate a second address identifying a location in a second memory, and an output SQI generator configured to read a memory location in the second memory that is identified by the second address in the second memory, defined as the read content, to calculate a scaling factor, and to further scale the read content by the scaling factor to generate a unit of the plurality of deinterleaved SQI units.

25. The deinterleaver of claim 23, wherein the compressed deinterleaver comprises:
a first address generator configured to generate a first address identifying a location in a first memory, a SQI compression block responsive to the input SQI units and configured to perform at least one of the operations of sampling, storing and reading the location identified by the first address; and
a second address generator configured to generate a plurality of addresses identifying a plurality of locations in a second memory, an output SQI generator configured to read the contents at the plurality of locations in the second memory and to perform an interpolation operation using the read contents to generate a unit of the plurality of deinterleaved SQI units.

26. The deinterleaver of claim 23, wherein the address generation operation by at least one of the first address generator and the second address generator includes a frequency deinterleaving operation.

27. The deinterleaver of claim 23, wherein the data deinterleaver is a convolutional deinterleaver having at total of B number of branches, B being an integer number greater than one and wherein each of the data units corresponds to a branch having a branch size and the value of L1 being set equal to the branch size of the branch of the data unit to which the input SQI unit corresponds, times B divided by K, K being the number of data sub-carriers in the communication system.

28. The deinterleaver of claim 23, wherein the SQI compression block is configured to perform at least one of the operations of compressing the plurality of input SQI units in time dimension, compressing the plurality of input SQI units in frequency dimension, and transforming the representation of the input SQI units to generate a result, and to further store the result, wherein the stored result comprises the plurality of compressed SQI units.

29. The deinterleaver of claim 23, wherein the SQI compression block is configured to jointly compress the plurality of input SQI units in time and frequency dimensions, to store the results of the joint compression and to perform an expansion operation on the stored result, the expansion operation comprising at least one of a read operation of at least one stored result, a scaling operation by a scaling factor, and a repetition operation, wherein the stored result comprises the plurality of compressed SQI units.

30. The method of claim 23, wherein said soft bit metric is a metric that indicates the likelihood that a bit is a value '1' or a value '0'.

* * * * *